United States Patent
Yamaguchi et al.

(10) Patent No.: US 12,388,471 B2
(45) Date of Patent: Aug. 12, 2025

(54) RADIO-FREQUENCY MODULE AND COMMUNICATION DEVICE

(71) Applicant: Murata Manufacturing Co., Ltd., Kyoto (JP)

(72) Inventors: Yukiya Yamaguchi, Kyoto (JP); Shogo Yanase, Kyoto (JP); Yuto Aoki, Kyoto (JP); Takanori Uejima, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 338 days.

(21) Appl. No.: 18/317,286

(22) Filed: May 15, 2023

(65) Prior Publication Data

US 2023/0283302 A1 Sep. 7, 2023

Related U.S. Application Data

(63) Continuation of application No. PCT/JP2021/042038, filed on Nov. 16, 2021.

(30) Foreign Application Priority Data

Dec. 24, 2020 (JP) ................................ 2020-215246

(51) Int. Cl.
*H03H 9/17* (2006.01)
*H03H 9/145* (2006.01)
(Continued)

(52) U.S. Cl.
CPC ........... *H04B 1/0053* (2013.01); *H03H 9/145* (2013.01); *H03H 9/25* (2013.01); *H03H 9/64* (2013.01)

(58) Field of Classification Search
CPC ........ H04B 1/0053; H04B 1/006; H04B 1/00; H04B 1/38; H03H 9/145; H03H 9/25; H03H 9/64; H03H 9/02102; H03H 9/02834; H03H 9/0542; H03H 9/0552; H03H 9/17; H03H 9/54; H01L 25/04; H01L 25/18
See application file for complete search history.

(56) References Cited

U.S. PATENT DOCUMENTS

| | | | |
|---|---|---|---|
| 8,723,392 B2 * | 5/2014 | Adkisson | H03H 3/08 333/194 |
| 11,894,829 B2 * | 2/2024 | Steinhaeusser | H10N 30/06 |

(Continued)

FOREIGN PATENT DOCUMENTS

| | | |
|---|---|---|
| JP | 2005-217670 A | 8/2005 |
| JP | 2020-102693 A | 7/2020 |

(Continued)

OTHER PUBLICATIONS

International Search Report for PCT/JP2021/042038 dated Feb. 1, 2022.

*Primary Examiner* — Davetta W Goins
(74) *Attorney, Agent, or Firm* — McDonald Hopkins LLC

(57) ABSTRACT

A radio-frequency module includes a module substrate having main surfaces facing each other, a transmission filter that has a bottom surface and a top surface facing each other and passes a radio-frequency signal, and an external connection terminal disposed on the main surface. The bottom surface faces the main surface and is disposed closer to the main surface than the top surface. The radio-frequency module further includes a metal electrode joined to the top surface.

19 Claims, 12 Drawing Sheets

(51) Int. Cl.
*H03H 9/25* (2006.01)
*H03H 9/54* (2006.01)
*H03H 9/64* (2006.01)
*H04B 1/00* (2006.01)

(56) References Cited

U.S. PATENT DOCUMENTS

| | | |
|---|---|---|
| 2009/0091904 A1 | 4/2009 | Hatanaka et al. |
| 2018/0159497 A1 | 6/2018 | Iwamoto et al. |
| 2019/0273312 A1 | 9/2019 | Otsubo |
| 2020/0203291 A1 | 6/2020 | Uejima |
| 2021/0210438 A1 | 7/2021 | Nomura et al. |
| 2021/0219419 A1 | 7/2021 | Takematsu et al. |

FOREIGN PATENT DOCUMENTS

| | | |
|---|---|---|
| WO | 2007/114224 A1 | 10/2007 |
| WO | 2017/043427 A1 | 3/2017 |
| WO | 2018/101384 A1 | 6/2018 |
| WO | 2020/067299 A1 | 4/2020 |
| WO | 2020/090230 A1 | 5/2020 |

\* cited by examiner

RADIO-FREQUENCY MODULE AND COMMUNICATION DEVICE

CROSS REFERENCE TO RELATED APPLICATION

This is a continuation of International Application No. PCT/JP2021/042038 filed on Nov. 16, 2021 which claims priority from Japanese Patent Application No. 2020-215246 filed on Dec. 24, 2020. The contents of these applications are incorporated herein by reference in their entireties.

BACKGROUND ART

Technical Field

The present disclosure relates to a radio-frequency module and a communication device.

In mobile communication devices, such as mobile phones, in particular, the layout and configuration of circuit elements constituting a radio-frequency front-end circuit becomes complicated as multiband support progresses.

Patent Document 1 discloses a radio-frequency module including a mounting substrate with both surfaces where circuit components can be mounted, and, of main surfaces facing each other of the mounting substrate, an acoustic wave filter disposed on or above a main surface where an external connection terminal is disposed.

Patent Document 1: Japanese Unexamined Patent Application Publication No. 2020-102693

BRIEF SUMMARY

In the radio-frequency module disclosed in Patent Document 1, however, heat of the acoustic wave filter disposed on or above the main surface where the external connection terminal is disposed is dissipated, mainly, through a terminal connected to the mounting substrate, and heat dissipation is therefore insufficient. As a result, in some cases, filter characteristics deteriorate due to a frequency shift due to changes in temperature in the acoustic wave filter.

The present disclosure has been made to solve the above-described issue and aims to provide a radio-frequency module and a communication device in which heat dissipation of an acoustic wave filter is improved.

A radio-frequency module according to an aspect of the present disclosure includes a module substrate having a first main surface and a second main surface facing each other, a first acoustic wave filter that has a first bottom surface and a first top surface facing each other and passes a radio-frequency signal, and an external connection terminal disposed on the second main surface. The first bottom surface faces the second main surface and is disposed closer to the second main surface than the first top surface. The radio-frequency module further includes a first metal electrode joined to the first top surface.

The present disclosure can provide the radio-frequency module and a communication device in which heat dissipation of the acoustic wave filter is improved.

DETAILED DESCRIPTION

Figure 1:
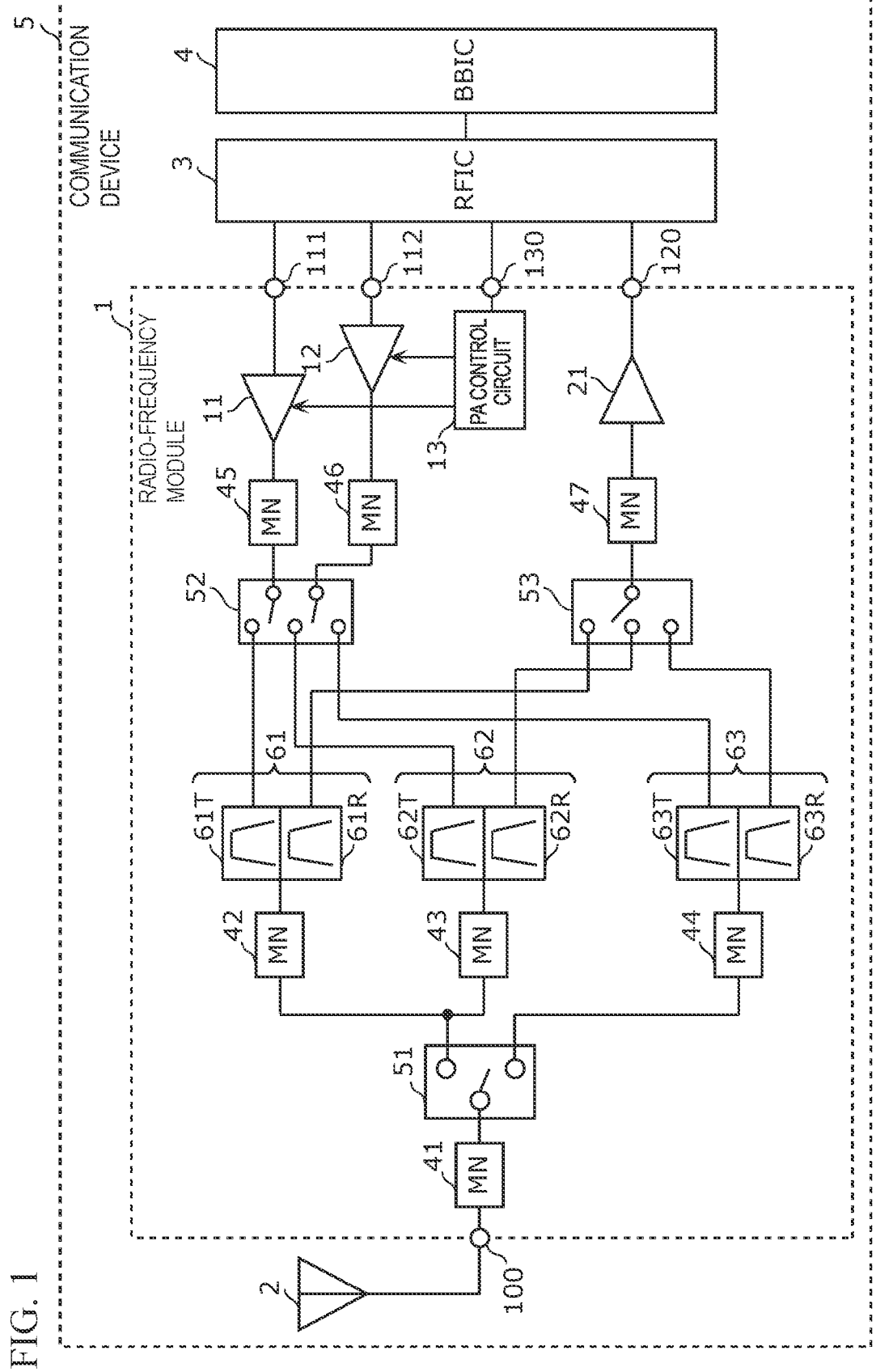
FIG. 1 is a circuit configuration diagram of a radio-frequency module and a communication device according to an embodiment.

Embodiments of the present disclosure will be described in detail below. Incidentally, all of the embodiments described below describe comprehensive or specific examples. Numerical values, shapes, materials, components, the arrangement and connection configuration of the components, and so forth that are described in the following embodiments are merely examples and are not intended to limit the present disclosure. Of components in the following examples and modifications, a component not described in an independent claim is described as an optional component. Furthermore, the sizes or size ratio of components illustrated in drawings are or is not necessarily exact. In figures, components that are substantially the same are denoted by the same reference signs, and a repeated description thereof is omitted or simplified in some cases.

Furthermore, in the following description, terms, such as parallel and perpendicular, representing a relationship between elements, a term, such as rectangular, representing the shape of an element, and a numerical range refer to not only their exact meanings but also the inclusion of a substantially equivalent range, for example, a difference of about a few percent.

Furthermore, in the following embodiments, "A is disposed on a first main surface of a substrate" refers to not only the fact that A is mounted directly on the first main surface but also the fact that, of a first main surface-side space and a second main surface-side space that are separated by the substrate, A is disposed in the first main surface-side space. That is, there is included the fact that A is mounted on the first main surface with another circuit element, an electrode, or the like interposed between A and the first main surface.

Furthermore, in the following embodiments, "A and B are connected to each other" does not only refer to the fact that A and B are in contact with each other but also defines the inclusion of the fact that A and B are electrically connected to each other via a conductor electrode, a conductor terminal, a line, another circuit component, or the like. Additionally, "something is connected between A and B" refers to the fact that something is connected to both A and B between A and B.

Furthermore, in the following embodiments, "A and B are joined to each other" refers to the fact that A and B are mechanically (physically) bonded together, and defines, in particular, the inclusion of the fact that one surface that A has and one surface that B has are bonded together.

In the following figures, an x axis and a y axis are axes orthogonal to each other on a plane parallel to a main surface of a module substrate. Furthermore, a z axis is an axis perpendicular to the main surface of the module substrate, a positive direction thereof represents an upward direction, and a negative direction thereof represents a downward direction.

Furthermore, in a module configuration in the present disclosure, "an object is viewed in plan" refers to the fact that the object is orthographically projected from a positive side of the z axis onto an x-y plane and is viewed. "A component is disposed on a main surface of a substrate" includes, in addition to the fact that the component is disposed on the main surface of the substrate with the component being in contact with the main surface, the fact that the component is disposed above the main surface without necessarily the component being in contact with the main surface, and the fact that part of the component is disposed so as to be embedded in the substrate from a main surface side.

Furthermore, in the following description, with respect to A, B, and C mounted in or on a substrate, "when the substrate (or a main surface of the substrate) is viewed in plan, C is disposed between A and B" refers to the fact that, when the substrate is viewed in plan, at least one of a plurality of line segments connecting points within a region of A with points within a region of B passes through a region of C. Furthermore, a description that the substrate is viewed in plan refers to the fact that the substrate and circuit elements mounted in or on the substrate are orthographically projected onto a plane parallel to the main surface of the substrate and are viewed.

Furthermore, in the following description, "transmission path" refers to a transmission line constituted by a line through which a radio-frequency transmission signal propagates, an electrode connected directly to the line, a terminal connected directly to the line or the electrode, and so forth. Additionally, "reception path" refers to a transmission line constituted by a line through which a radio-frequency reception signal propagates, an electrode connected directly to the line, a terminal connected directly to the line or the electrode, and so forth.

EMBODIMENT

1. Circuit Configuration of Radio-Frequency Module 1 and Communication Device 5

FIG. 1 is a circuit configuration diagram of a radio-frequency module 1 and a communication device 5 according to an embodiment. As illustrated in FIG. 1, the communication device 5 includes the radio-frequency module 1, an antenna 2, an RF signal processing circuit (RFIC) 3, and a baseband signal processing circuit (BBIC) 4.

The RFIC 3 is an RF signal processing circuit that processes radio-frequency signals transmitted and received by the antenna 2. Specifically, the RFIC 3 performs, for example, through down-conversion, signal processing on a radio-frequency reception signal input through a reception signal path of the radio-frequency module 1 and outputs a reception signal generated through this signal processing to the BBIC 4. Furthermore, the RFIC 3 performs, for example, through up-conversion, signal processing on a transmission signal input from the BBIC 4 and outputs a radio-frequency transmission signal generated through this signal processing to a transmission signal path of the radio-frequency module 1.

The BBIC 4 is a circuit that performs signal processing by using an intermediate frequency band lower in frequency than a radio-frequency signal that propagates through the radio-frequency module 1. A signal processed by the BBIC 4 is used, for example, as an image signal for displaying an image, or is used as a voice signal for a phone call through a speaker.

Furthermore, the RFIC 3 also has a function of a control unit that controls, in accordance with a communication band (frequency band) that is used, connections of switches 51, 52, and 53 included in the radio-frequency module 1. Specifically, the RFIC 3 switches between connections of the switches 51 to 53 included in the radio-frequency module 1 in accordance with a control signal (not illustrated). Specifically, the RFIC 3 outputs, to a PA control circuit 13, a digital control signal for controlling the switches 51 to 53. The PA control circuit 13 of the radio-frequency module 1 outputs, in accordance with the digital control signal input from the RFIC 3, a digital control signal to the switches 51 to 53 to thereby control connection and disconnection of each of the switches 51 to 53.

Furthermore, the RFIC 3 also has a function of the control unit that controls gains of power amplifiers 11 and 12 included in the radio-frequency module 1, and a power-supply voltage Vcc and a bias voltage Vbias that are to be supplied to the power amplifiers 11 and 12. Specifically, the RFIC 3 outputs a digital control signal to a control signal terminal 130 of the radio-frequency module 1. The PA control circuit 13 outputs, in accordance with the digital control signal input through the control signal terminal 130, a control signal, a power-supply voltage Vcc, or a bias voltage Vbias to the power amplifiers 11 and 12 to adjust the gains of the power amplifiers 11 and 12. Incidentally, the control unit may be provided outside the RFIC 3. The control unit may be provided, for example, in the BBIC 4.

The antenna 2 is connected to an antenna connection terminal 100 of the radio-frequency module 1 and radiates a radio-frequency signal output from the radio-frequency module 1. Furthermore, the antenna 2 receives a radio-frequency signal from the outside and outputs the radio-frequency signal to the radio-frequency module 1.

Incidentally, in the communication device 5 according to the present embodiment, the antenna 2 and the BBIC 4 are not indispensable components.

Next, a detailed configuration of the radio-frequency module 1 will be described.

As illustrated in FIG. 1, the radio-frequency module 1 includes the power amplifiers 11 and 12, a low noise amplifier 21, the PA control circuit 13, transmission filters 61T, 62T, and 63T, reception filters 61R, 62R, and 63R, matching networks 41, 42, 43, 44, 45, 46, and 47, the switches 51, 52, and 53, the antenna connection terminal 100, transmission input terminals 111 and 112, a reception output terminal 120, and the control signal terminal 130.

The antenna connection terminal 100 is connected to the antenna 2. The transmission input terminals 111 and 112 are terminals for receiving a transmission signal from the outside of the radio-frequency module 1 (from the RFIC 3). The reception output terminal 120 is a terminal for supplying a reception signal to the outside of the radio-frequency module 1 (to the RFIC 3).

The power amplifier 11 is a transmission amplifier that can amplify at least one of transmission signals in a first band, a second band, and a third band. An input terminal of the power amplifier 11 is connected to the transmission input terminal 111, and an output terminal of the power amplifier 11 is connected to the switch 52 via the matching network 45.

The power amplifier 12 is a transmission amplifier that can amplify at least one of transmission signals in the first band, the second band, and the third band. An input terminal of the power amplifier 12 is connected to the transmission input terminal 112, and an output terminal of the power amplifier 12 is connected to the switch 52 via the matching network 46.

The low noise amplifier 21 is a reception amplifier that can amplify reception signals in the first band, the second band, and the third band with low noise. An input terminal of the low noise amplifier 21 is connected to the switch 53 via the matching network 47, and an output terminal of the low noise amplifier 21 is connected to the reception output terminal 120.

The PA control circuit 13 adjusts the gains of the power amplifiers 11 and 12, for example, in accordance with a digital control signal input through the control signal terminal 130. Incidentally, the PA control circuit 13 may be formed by a semiconductor IC (Integrated Circuit). The semiconductor IC is constructed, for example, by CMOS (Complementary Metal Oxide Semiconductor). Specifically, the semiconductor IC is formed by a SOI (Silicon On Insulator) process. Thus, semiconductor ICs can be fabricated inexpensively. Incidentally, the semiconductor IC may be made of at least any of GaAs, SiGe, and GaN. Thus, a radio-frequency signal having high-quality amplification performance and noise performance can be output.

The transmission filter 61T is disposed in a transmission path connecting the power amplifiers 11 and 12 and the switch 51 and passes, of transmission signals amplified by the power amplifier 11 or 12, a transmission signal in a transmission band of the third band.

Furthermore, the transmission filter 62T is an example of a first acoustic wave filter and a second acoustic wave filter. The transmission filter 62T is disposed in a transmission path connecting the power amplifiers 11 and 12 and the switch 51 and passes, of transmission signals amplified by the power amplifier 11 or 12, a transmission signal in a transmission band of the second band.

Additionally, the transmission filter 63T is an example of the first acoustic wave filter and the second acoustic wave filter. The transmission filter 63T is disposed in a transmission path connecting the power amplifiers 11 and 12 and the switch 51 and passes, of transmission signals amplified by the power amplifier 11 or 12, a transmission signal in a transmission band of the first band.

The reception filter 61R is disposed in a reception path connecting the low noise amplifier 21 and the switch 51 and passes, of reception signals input from the antenna connection terminal 100, a reception signal in a reception band of the third band. Furthermore, the reception filter 62R is disposed in a reception path connecting the low noise amplifier 21 and the switch 51 and passes, of reception signals input from the antenna connection terminal 100, a reception signal in a reception band of the second band. Additionally, the reception filter 63R is disposed in a reception path connecting the low noise amplifier 21 and the switch 51 and passes, of reception signals input from the antenna connection terminal 100, a reception signal in a reception band of the first band.

Incidentally, the above-described transmission filters 62T and 63T are, for example, acoustic wave filters using Surface Acoustic Waves (SAWs) or Bulk Acoustic Waves (BAWs). Furthermore, each of the transmission filter 61T, the reception filters 61R, 62R, and 63R may be, for example, any of a SAW filter, a BAW filter, an LC resonant filter, and a dielectric filter and is further not limited to these.

The transmission filter 61T and the reception filter 61R constitute a duplexer 61 whose pass band is the third band. Furthermore, the transmission filter 62T and the reception filter 62R constitute a duplexer 62 whose pass band is the second band different from the first band. Additionally, the transmission filter 63T and the reception filter 63R constitute a duplexer 63 whose pass band is the first band.

Incidentally, each of the duplexers 61 to 63 may be one filter that performs transmission by using a Time Division Duplex (TDD) system. In this case, a switch for switching between transmission and reception is disposed in at least one of stages preceding and subsequent to the above-described one filter.

The matching network 41 is disposed in a transmission-reception path connecting the antenna connection terminal 100 and the switch 51 and provides impedance matching between the antenna 2 and the switch 51. Incidentally, the matching network 41 may include at least one inductor. Furthermore, the matching network 41 may be disposed in series with the above-described transmission-reception path or may be connected between the transmission-reception path and a ground.

The matching network 42 is disposed in a transmission-reception path connecting the switch 51 and the duplexer 61 and provides impedance matching between the switch 51 and the duplexer 61. Incidentally, the matching network 42 may include at least one inductor. Furthermore, the matching network 42 may be disposed in series with the above-described transmission-reception path or may be connected between the transmission-reception path and a ground. The matching network 43 is disposed in a transmission-reception path connecting the switch 51 and the duplexer 62 and provides impedance matching between the switch 51 and the duplexer 62. Incidentally, the matching network 43 may include at least one inductor. Furthermore, the matching network 43 may be disposed in series with the above-described transmission-reception path or may be connected between the transmission-reception path and a ground. The matching network 44 is disposed in a transmission-reception path connecting the switch 51 and the duplexer 63 and provides impedance matching between the switch 51 and the duplexer 63. Incidentally, the matching network 44 may include at least one inductor. Furthermore, the matching network 44 may be disposed in series with the above-described transmission-reception path or may be connected between the transmission-reception path and a ground.

The matching network 45 is disposed in a transmission path connecting the power amplifier 11 and the switch 52 and provides impedance matching between the power amplifier 11 and the switch 52. Incidentally, the matching network 45 includes at least one inductor. Furthermore, the matching network 45 may be disposed in series with the above-described transmission path or may be connected between the transmission path and a ground. The matching network 46 is disposed in a transmission path connecting the power amplifier 12 and the switch 52 and provides impedance matching between the power amplifier 12 and the switch 52. Incidentally, the matching network 46 includes at least one inductor. Furthermore, the matching network 46 may be disposed in series with the above-described transmission path or may be connected between the transmission path and a ground. The matching network 47 is disposed in a reception path connecting the low noise amplifier 21 and the switch 53 and provides impedance matching between the low noise amplifier 21 and the switch 53. Incidentally, the matching network 47 includes at least one inductor. Furthermore, the matching network 47 may be disposed in series with the above-described reception path or may be connected between the reception path and a ground.

Incidentally, the matching networks 41 to 47 do not have to be included. Furthermore, a matching network may be disposed at least at any of locations between the transmission filter 61T and the switch 52, between the transmission filter 62T and the switch 52, between the transmission filter 63T and the switch 52, between the reception filter 61R and the switch 53, between the reception filter 62R and the switch 53, and between the reception filter 63R and the switch 53.

The switch 51 includes a common terminal, a first selection terminal, and a second selection terminal. The common terminal is connected to the antenna connection terminal 100 via the matching network 41. The first selection terminal is connected to the duplexer 61 via the matching network 42 and is connected to the duplexer 62 via the matching network 43. The second selection terminal is connected to the duplexer 63 via the matching network 44. That is, the switch 51 is an antenna switch disposed between the antenna connection terminal 100 and the duplexers 61 to 63. The switch 51 switches between connection and disconnection of (1) the antenna connection terminal 100 with the duplexers 61 and 62, and switches between connection and disconnection of (2) the antenna connection terminal 100 with the duplexer 63. Incidentally, the switch 51 is constituted by a multi-connection switch circuit that can establish simultaneous connections of both the above-described (1) and (2).

The switch 52 is an example of a first switch and includes a first common terminal, a second common terminal, a first selection terminal, a second selection terminal, and a third selection terminal. The switch 52 is disposed between the power amplifiers 11 and 12 and the transmission filters 61T, 62T, and 63T. The first common terminal is connected to the output terminal of the power amplifier 11 via the matching network 45. The second common terminal is connected to the output terminal of the power amplifier 12 via the matching network 46. The first selection terminal is connected to the transmission filter 61T, the second selection terminal is connected to the transmission filter 62T, and the third selection terminal is connected to the transmission filter 63T. In the above-described connection configuration, the switch 52 switches the connection of the power amplifier 11 between the transmission filters 61T, 62T, and 63T and also switches the connection of the power amplifier 12 between the transmission filters 61T, 62T, and 63T. The switch 52 is constituted, for example, by a DP3T (Double Pole 3 Throw) switch circuit. Incidentally, the switch 52 may be constituted, for example, by a plurality of switch circuits including at least one of an SPDT (Single Pole Double Throw) switch and an SP3T (Single Pole 3 Throw) switch.

The switch 53 includes a common terminal, a first selection terminal, a second selection terminal, and a third selection terminal and is disposed between the low noise amplifier 21 and the reception filters 61R, 62R, and 63R. The common terminal is connected to the input terminal of the low noise amplifier 21 via the matching network 47. The first selection terminal is connected to the reception filter 61R, the second selection terminal is connected to the reception filter 62R, and the third selection terminal is connected to the reception filter 63R. In the above-described connection configuration, the switch 53 switches the connection of the low noise amplifier 21 between the reception filters 61R, 62R, and 63R. The switch 53 is constituted, for example, by an SP3T switch circuit. Incidentally, the switch 53 may be constituted, for example, by a plurality of switch circuits including an SPDT switch.

Note that, in a radio-frequency module according to the present disclosure, of circuit components illustrated in FIG. 1, at least the transmission filter 63T only has to be included.

Here, in the radio-frequency module 1 having the above-described circuit configuration, the transmission filter 63T passes a high-power transmission signal and is therefore likely to generate heat to result in insufficient heat dissipation. Thus, in some cases, filter characteristics deteriorate. A configuration will be described below in which heat dissipation of the radio-frequency module 1 according to the present embodiment is improved.

2. Layout and Configuration of Circuit Components of Radio-Frequency Module 1A According to Example 1

Figure 2A:
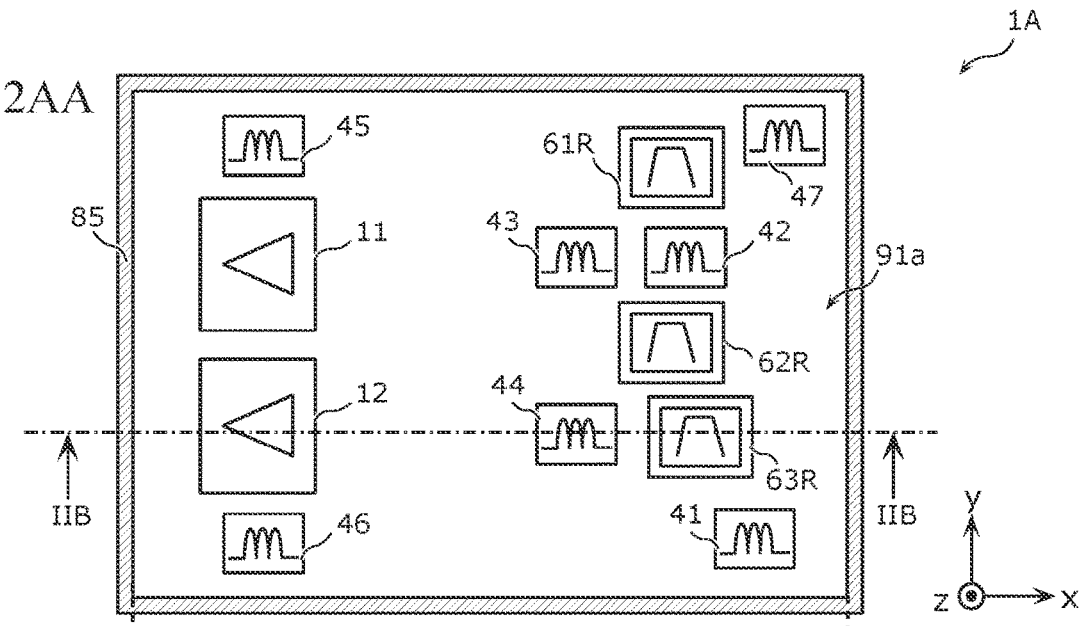
FIGS. 2AA and 2AB include plan views of a radio-frequency module according to Example 1.
Figure 2A:
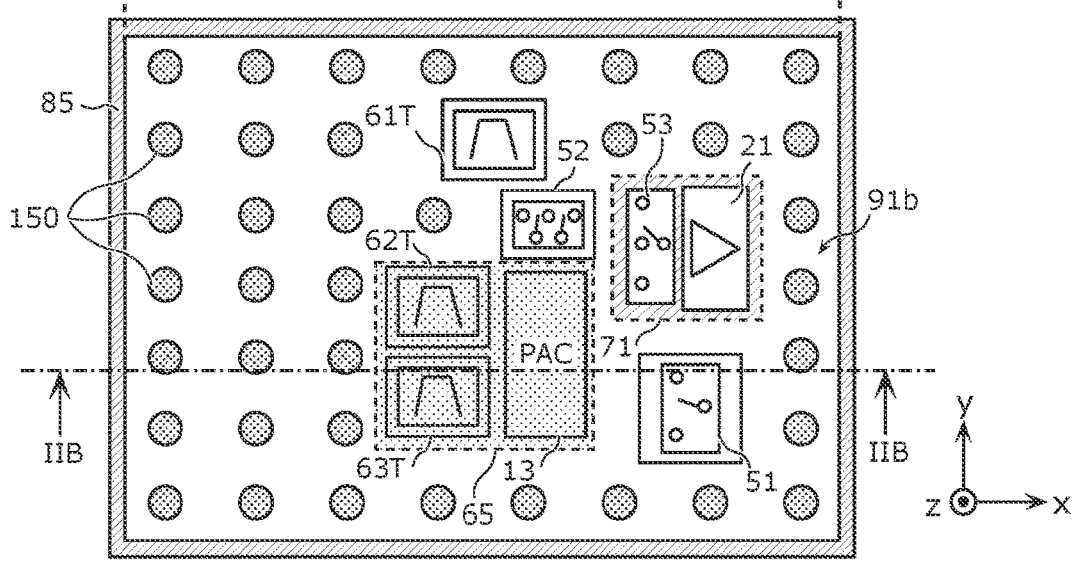
Figure 2B:
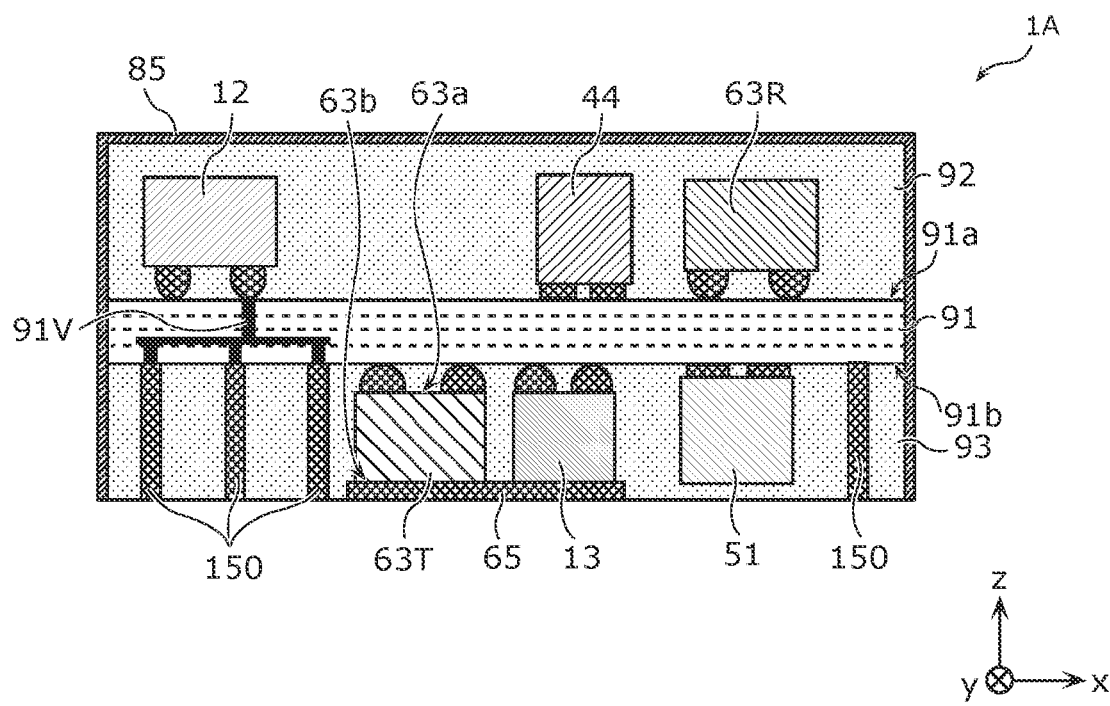
FIG. 2B is a cross-sectional view of the radio-frequency module according to Example 1.

FIGS. 2AA and 2AB include plan views of a radio-frequency module 1A according to Example 1. Furthermore, FIG. 2B is a cross-sectional view of the radio-frequency module 1A according to Example 1, specifically, a cross-sectional view taken along line IIB-IIB in FIGS. 2AA and 2AB. Besides, FIG. 2AA illustrates the layout of circuit components when, of main surfaces 91a and 91b facing each other of a module substrate 91, the main surface 91a is viewed from a positive side of a z axis. On the other hand, FIG. 2AB illustrates the layout of circuit components as seen through the main surface 91b when the main surface 91b is viewed from the positive side of the z axis.

Furthermore, in FIGS. 2AA and 2AB, although the circuit components have marks representing their functions to facilitate understanding of a layout relationship between the circuit components, these marks are not put in the actual radio-frequency module 1A.

The radio-frequency module 1A according to Example 1 specifically represents the layout and configuration of circuit elements constituting the radio-frequency module 1 according to the embodiment.

As illustrated in FIGS. 2AA, 2AB, and 2B, the radio-frequency module 1A according to this example further includes the module substrate 91, resin members 92 and 93, external connection terminals 150, a metal shield layer 85, and a metal electrode 65 in addition to the circuit configuration illustrated in FIG. 1.

The module substrate 91 has the main surfaces 91a and 91b facing each other and is a substrate where circuit components constituting the radio-frequency module 1A are mounted. As the module substrate 91, for example, a Low Temperature Co-fired Ceramics (LTCC) substrate having a multilayer structure including a plurality of dielectric layers, a High Temperature Co-fired Ceramics (HTCC) substrate, a substrate with a built-in component, a substrate with a Redistribution Layer (RDL), or a printed substrate is used.

Furthermore, in this example, the main surface 91a corresponds to a first main surface, and the main surface 91b corresponds to a second main surface.

Incidentally, although not illustrated, the antenna connection terminal 100, the transmission input terminals 111 and 112, the reception output terminal 120, and the control signal terminal 130 may be formed on the main surface 91b.

The resin member 92 is disposed on the main surface 91a and covers some of the circuit components constituting the radio-frequency module 1A and the main surface 91a. The resin member 93 is disposed on the main surface 91b and covers some of the circuit components constituting the radio-frequency module 1A and the main surface 91b. The resin members 92 and 93 have a function of ensuring the reliability, for example, of mechanical strength and resistance to moisture of the circuit components constituting the radio-frequency module 1A. Incidentally, the resin members 92 and 93 are not components indispensable to the radio-frequency module 1 according to the present embodiment.

The metal shield layer 85 is formed on a surface of the resin member 92 and is set at ground potential. The metal shield layer 85 is a metal thin film formed, for example, by using a sputtering method and is copper, an alloy containing copper, or a multilayer body containing copper. Incidentally, the metal shield layer 85 is not a component indispensable to the radio-frequency module 1 according to the present embodiment.

As illustrated in FIGS. 2AA, 2AB, and 2B, in the radio-frequency module 1A according to this example, the power amplifiers 11 and 12, the reception filters 61R, 62R, and 63R, and the matching networks 41, 42, 43, 44, 45, 46, and 47 are disposed on the main surface 91a. On the other hand, the low noise amplifier 21, the transmission filters 61T, 62T, and 63T, the PA control circuit 13, the switches 51, 52, and 53 are disposed on the main surface 91b.

Incidentally, although not illustrated in FIGS. 2AA and 2AB, lines connecting the circuit components illustrated in FIG. 1 are formed within the module substrate 91 and on the main surfaces 91a and 91b. Furthermore, each of the above-described lines may be a bonding wire with each end bonded to any of the main surfaces 91a and 91b and the circuit components constituting the radio-frequency module 1A, or alternatively may be a terminal, an electrode, or a line formed on a surface of a circuit component constituting the radio-frequency module 1A.

Furthermore, in the radio-frequency module 1A according to this example, a plurality of external connection terminals 150 are disposed on the main surface 91b. The radio-frequency module 1A exchanges electrical signals with an external substrate disposed on a negative side of the z axis of the radio-frequency module 1A through the plurality of external connection terminals 150. Furthermore, some of the plurality of external connection terminals 150 are set at ground potential of the external substrate. Of the main surfaces 91a and 91b, on the main surface 91b facing the external substrate, a circuit component that is difficult to reduce in height is not disposed, but the low noise amplifier 21, the switches 51 to 53, the PA control circuit 13, and the transmission filters 61T to 63T that are easy to reduce in height are disposed.

Incidentally, the external connection terminals 150 may be columnar electrodes extending through the resin member 93 in a z-axis direction as illustrated in FIGS. 2AA, 2AB, and 2B. Alternatively, the external connection terminals 150 may be bump electrodes formed on the main surface 91b. In this case, the resin member 93 on the main surface 91b does not have to be provided.

Furthermore, in the radio-frequency module 1A according to this example, the transmission filter 63T has to be disposed on the main surface 91b, and the other circuit components may be disposed on either the main surface 91a or 91b.

The transmission filter 63T is an example of the first acoustic wave filter and has a bottom surface 63a (first bottom surface) and a top surface 63b (first top surface) facing each other. As illustrated in FIG. 2B, the bottom surface 63a faces the main surface 91b and is disposed closer to the main surface 91b than the top surface 63b.

The metal electrode 65 is an example of a first metal electrode and is joined to the top surface 63b.

The transmission filter 63T is a circuit component that passes a transmission signal amplified by the power amplifier 11 or 12 and is thus, of the circuit components included in the radio-frequency module 1A, a component that generates a large amount of heat. To improve the heat dissipation of the radio-frequency module 1A, it is suitable to dissipate heat generated by the transmission filter 63T to the external substrate by using a heat dissipation path with a small thermal resistance. If no metal electrode 65 is provided, as a heat dissipation path of the transmission filter 63T, a heat dissipation path running only through a planar wiring pattern (along an x-y planar direction) on the main surface 91b is included. The above-described planar wiring pattern is formed from a metal thin film and thus has a large thermal resistance. As a result, if the transmission filter 63T is disposed on the main surface 91b, heat dissipation is reduced.

On the other hand, in the radio-frequency module 1A according to this example, the metal electrode 65 is joined to the top surface 63b of the transmission filter 63T as illustrated in FIG. 2B, and thus heat generated by the transmission filter 63T can be dissipated to an external substrate side through the metal electrode 65. That is, heat can be dissipated not only through, as a heat dissipation path of the transmission filter 63T, a heat dissipation path running through the module substrate 91, but also from the top surface 63b of the transmission filter 63T without necessarily passing through the module substrate 91. Hence, the radio-frequency module 1A can be provided in which heat dissipation of the transmission filter 63T, which is an acoustic wave filter, is improved.

Furthermore, as illustrated in FIGS. 2AA and 2AB, the metal electrode 65 may be further joined to the transmission filter 63T and to the PA control circuit 13.

This further improves the heat dissipation of the radio-frequency module 1A.

Furthermore, the radio-frequency module 1A further includes a via conductor 91V (first via conductor) formed within the module substrate 91 and connecting the main surfaces 91a and 91b. One end of the via conductor 91V is connected to a ground electrode of the power amplifier 11 or 12 at the main surface 91a, and other ends of the via conductor 91V are connected to a plurality of external connection terminals 150 at the main surface 91b.

Each of the power amplifiers 11 and 12 is, of the circuit components included in the radio-frequency module 1A, a component that generates a large amount of heat. To improve the heat dissipation of the radio-frequency module 1A, it is suitable to dissipate heat generated by the power amplifiers 11 and 12 to the external substrate by using a heat dissipation path with a small thermal resistance. If the power amplifiers 11 and 12 are mounted in or on the main surface 91*b*, an electrode line to be connected to the power amplifiers 11 and 12 is disposed on the main surface 91*b*. For this reason, as a heat dissipation path, a heat dissipation path running only through a planar wiring pattern (along the x-y planar direction) on the main surface 91*b* is included. The above-described planar wiring pattern is formed from a metal thin film and thus has a large thermal resistance. As a result, if the power amplifiers 11 and 12 are disposed on the main surface 91*b*, heat dissipation is reduced.

On the other hand, as illustrated in FIG. 2B, the radio-frequency module 1A according to this example further includes the via conductor 91V for heat dissipation connected to the ground electrode of the power amplifier 11 or 12 at the main surface 91*a* and extending from the main surface 91*a* to the main surface 91*b*. Furthermore, the via conductor 91V is connected to the external connection terminals 150 set at the ground potential at the main surface 91*b*.

Thus, the power amplifier 11 or 12 can be connected to the external connection terminals 150 via the via conductor 91V for heat dissipation. Hence, as a heat dissipation path of the power amplifier 11 or 12, of lines in the module substrate 91, a heat dissipation path running only through the planar wiring pattern that has a large thermal resistance and is provided along the x-y planar direction can be excluded. Thus, the small-sized radio-frequency module 1A can be provided in which heat dissipation from the power amplifier 11 or 12 to the external substrate is improved.

Furthermore, in the radio-frequency module 1A according to this example, the low noise amplifier 21 and the switch 53 are included in a semiconductor IC 71. Thus, the radio-frequency module 1A can be reduced in size.

Furthermore, the power amplifiers 11 and 12, and the low noise amplifier 21 are provided on both the surfaces of the module substrate 91 such that the power amplifiers 11 and 12 are separated from the low noise amplifier 21 with the module substrate 91 interposed between the power amplifiers 11 and 12 and the low noise amplifier 21, thus enabling an improvement in isolation between transmission and reception.

Figure 2C:
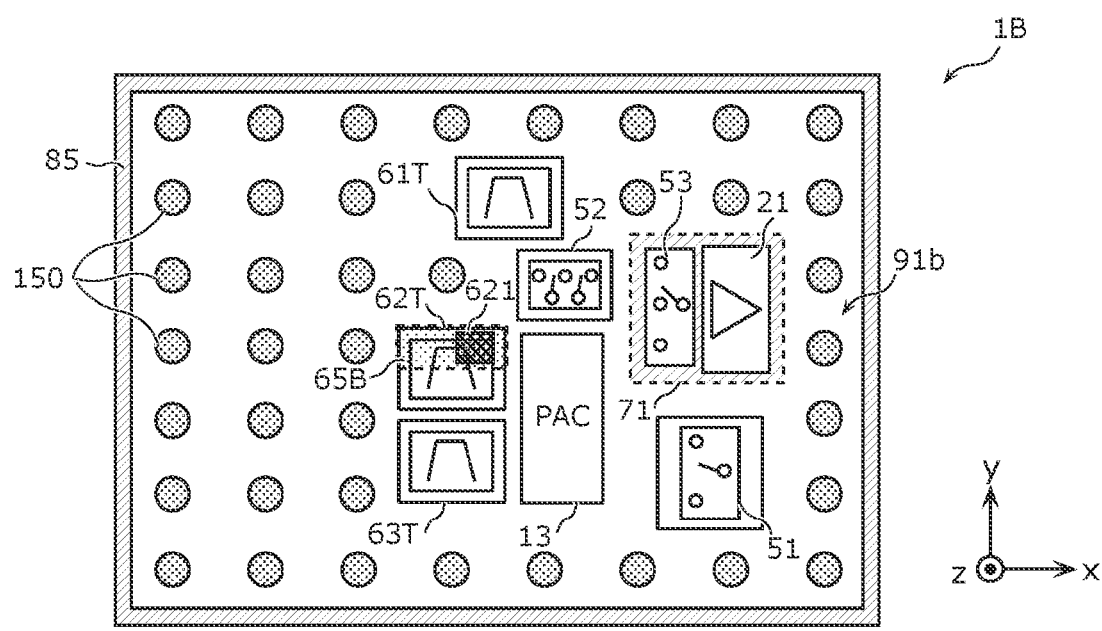
FIG. 2C is a plan view of a radio-frequency module according to Modification 1.

FIG. 2C is a plan view of a radio-frequency module 1B according to Modification 1. When compared with the radio-frequency module 1A according to Example 1, the radio-frequency module 1B illustrated in FIG. 2C differs from the radio-frequency module 1A only in the placement and configuration of a metal electrode 65B. In the radio-frequency module 1B according to this modification, a description of a configuration that is the same as a configuration in the radio-frequency module 1A according to Example 1 is omitted, and a description will be given below with emphasis on a configuration different from the configuration in the radio-frequency module 1A.

In this modification, the transmission filter 62T is an example of the first acoustic wave filter and has a bottom surface 62*a* and a top surface 62*b* facing each other. The bottom surface 62*a* faces the main surface 91*b* and is disposed closer to the main surface 91*b* than the top surface 62*b*. The transmission filter 63T is an example of a second filter. In the transmission filter 62T, an input-output terminal 621 is formed on the bottom surface 62*a*. The input-output terminal 621 is an example of a first input-output terminal and is connected to the second selection terminal of the switch 52.

The metal electrode 65B is an example of the first metal electrode and is joined to the top surface 62*b*.

Here, when the top surface 62*b* is viewed in plan, the input-output terminal 621 and the metal electrode 65B overlap each other.

Thus, since the input-output terminal 621 that generates the largest amount of heat in the transmission filter 62T and whose temperature is likely to reach a high temperature and the metal electrode 65B overlap each other when the top surface 62*b* is viewed in plan, heat dissipation of the transmission filter 62T, which is an acoustic wave filter, can be improved more effectively.

3. Layout and Configuration of Circuit Components of Radio-Frequency Module 1C According to Example 2

Figure 3A:
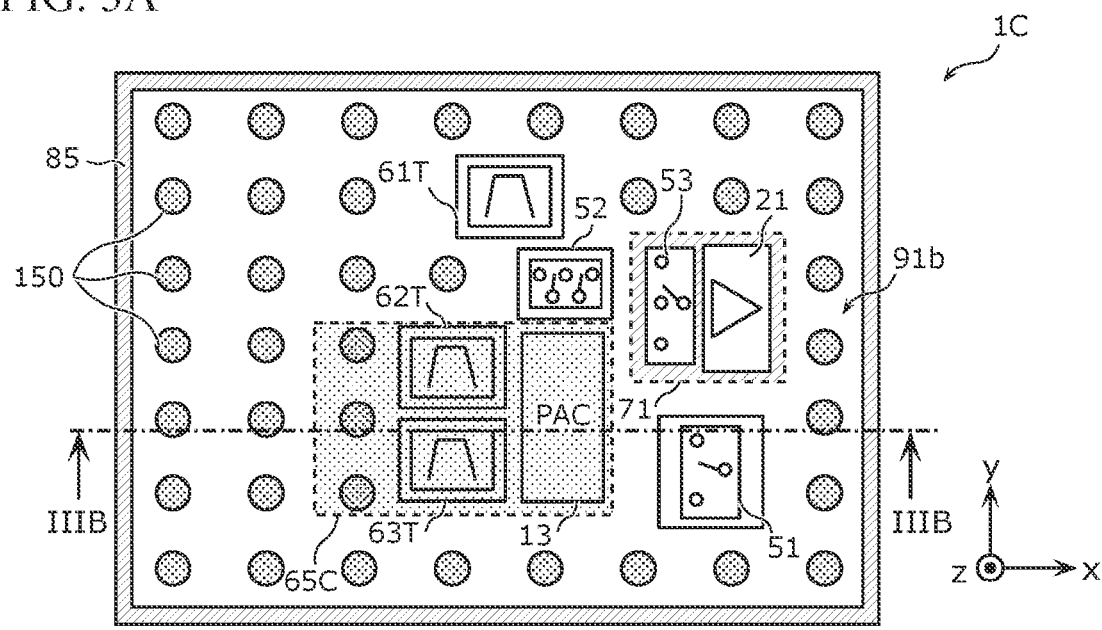
FIG. 3A is a plan view of a radio-frequency module according to Example 2.
Figure 3B:
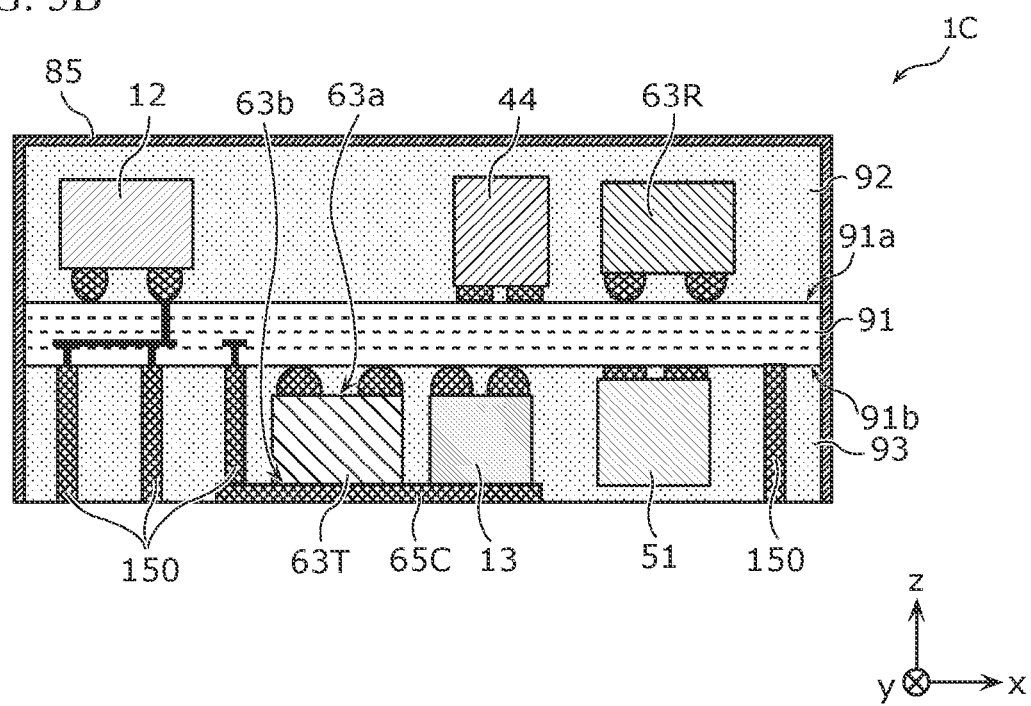
FIG. 3B is a cross-sectional view of the radio-frequency module according to Example 2.

FIG. 3A is a plan view of a radio-frequency module 1C according to Example 2. Furthermore, FIG. 3B is a cross-sectional view of the radio-frequency module 1C according to Example 2, specifically, a cross-sectional view taken along line IIIB-IIIB in FIG. 3A. Incidentally, FIG. 3A illustrates, when, of the main surfaces 91*a* and 91*b* facing each other of the module substrate 91, the main surface 91*b* is viewed from the positive side of the z axis, the layout of circuit components as seen through the main surface 91*b*. Furthermore, in FIG. 3A, although the circuit components have marks representing their functions to facilitate understanding of a layout relationship between the circuit components, these marks are not put in the actual radio-frequency module 1C.

The radio-frequency module 1C according to Example 2 specifically represents the layout and configuration of circuit elements constituting the radio-frequency module 1 according to the embodiment.

When compared with the radio-frequency module 1A according to Example 1, the radio-frequency module 1C illustrated in FIGS. 3A and 3B differs from the radio-frequency module 1A only in the placement and configuration of a metal electrode 65C. In the radio-frequency module 1C according to this example, a description of a configuration that is the same as a configuration in the radio-frequency module 1A according to Example 1 is omitted, and a description will be given below with emphasis on a configuration different from the configuration in the radio-frequency module 1A.

The metal electrode 65C is an example of the first metal electrode and is joined to the top surface 63*b* as illustrated in FIG. 3B. Furthermore, on a plane containing the top surface 63*b*, the metal electrode 65C is joined to external connection terminals 150 set at the ground potential.

In the above-described configuration, the metal electrode 65C serves as a ground electrode, a transmission signal and a harmonic that are radiated from the transmission filter 63T can thus be suppressed, and noise can also be kept from entering the transmission filter 63T from the outside. Hence, isolation between signals can be improved while the heat dissipation of the radio-frequency module 1C is improved.

Incidentally, in the radio-frequency module 1C according to this example, although the metal electrode 65C and the main surface 91*b* are connected to each other via the external connection terminals 150, the metal electrode 65C and a ground electrode formed on the main surface 91*b* may be connected to each other via a bonding wire.

Figure 3C:
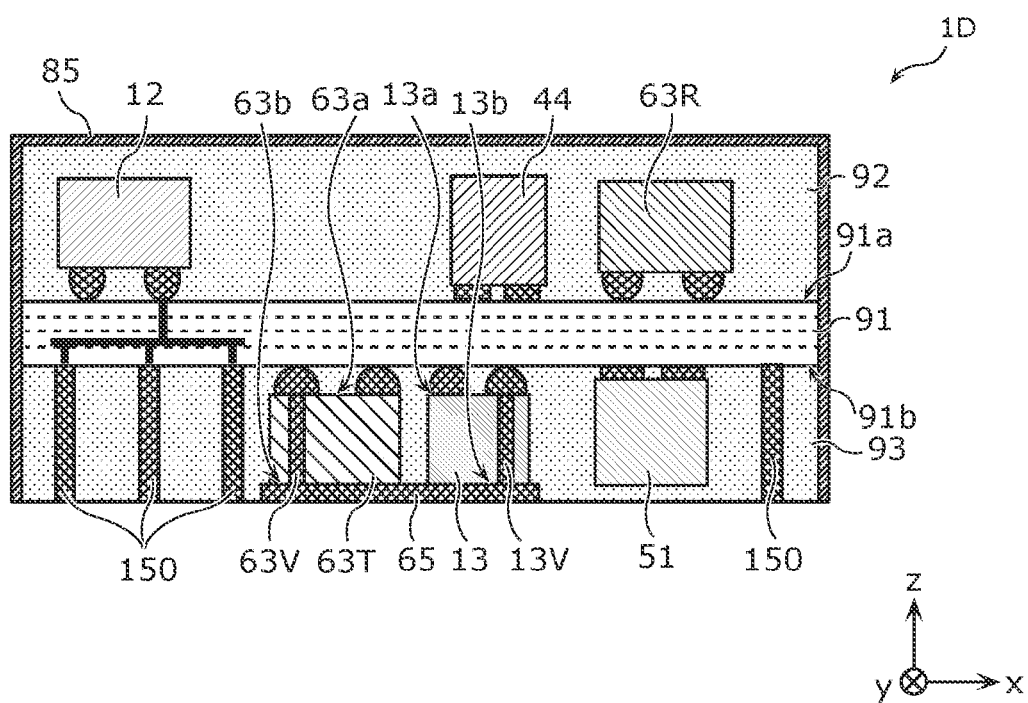
FIG. 3C is a cross-sectional view of a radio-frequency module according to Modification 2.

FIG. 3C is a cross-sectional view of a radio-frequency module 1D according to Modification 2. When compared with the radio-frequency module 1A according to Example 1, the radio-frequency module 1D illustrated in FIG. 3C differs from the radio-frequency module 1A only in that the radio-frequency module 1D further includes via conductors 63V and 13V. In the radio-frequency module 1D according to this modification, a description of a configuration that is the same as a configuration in the radio-frequency module 1A according to Example 1 is omitted, and a description will be given below with emphasis on a configuration different from the configuration in the radio-frequency module 1A.

In the transmission filter 63T, the via conductor 63V (second via conductor) connecting the bottom surface 63a and the top surface 63b is formed. One end of the via conductor 63V is connected to the ground electrode formed on the main surface 91b, and the other end of the via conductor 63V is connected to the metal electrode 65.

In the above-described configuration, the metal electrode 65 serves as a ground electrode, a transmission signal and a harmonic that are radiated from the transmission filter 63T can thus be suppressed, and noise can also be kept from entering the transmission filter 63T from the outside. Hence, isolation between signals can be improved while the heat dissipation of the radio-frequency module 1D is improved.

Furthermore, the PA control circuit 13 has main surfaces 13a and 13b facing each other. As illustrated in FIG. 3C, the main surface 13a faces the main surface 91b and is disposed closer to the main surface 91b than the main surface 13b.

In the PA control circuit 13, the via conductor 13V connecting the main surface 13a and main surface 13b is formed. One end of the via conductor 13V is connected to the ground electrode formed on the main surface 91b, and the other end of the via conductor 13V is connected to the metal electrode 65.

In the above-described configuration, the metal electrode 65 serves as a ground electrode, digital noise radiated from the PA control circuit 13 can thus be suppressed, and noise can also be kept from entering the PA control circuit 13 from the outside.

4. Layout and Configuration of Circuit Components of Radio-Frequency Module 1E According to Example 3

Figure 4A:
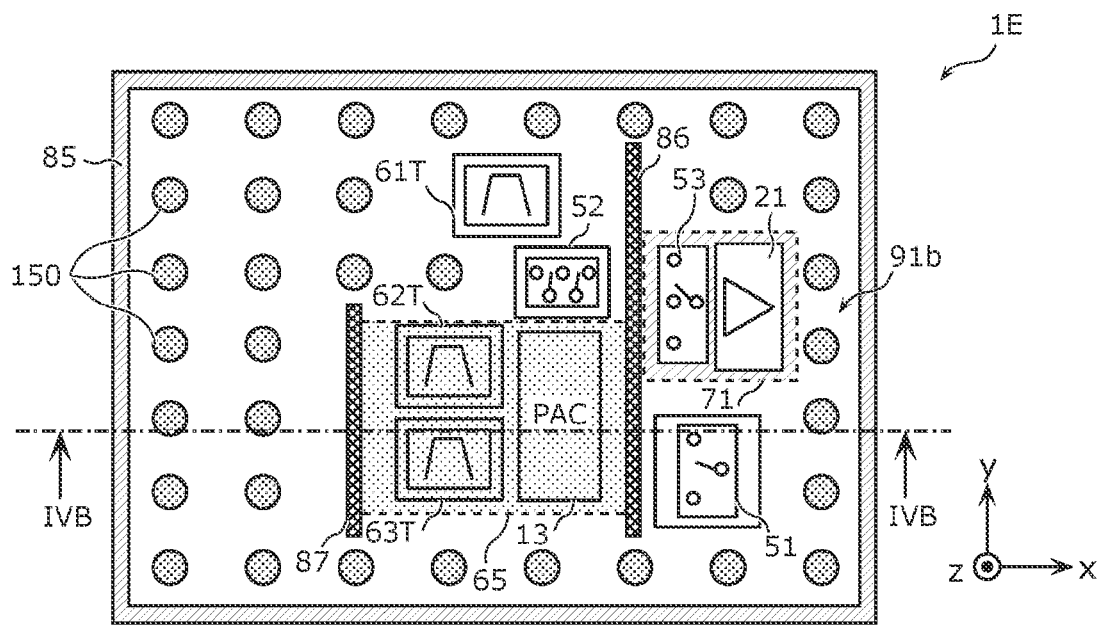
FIG. 4A is a plan view of a radio-frequency module according to Example 3.
Figure 4B:
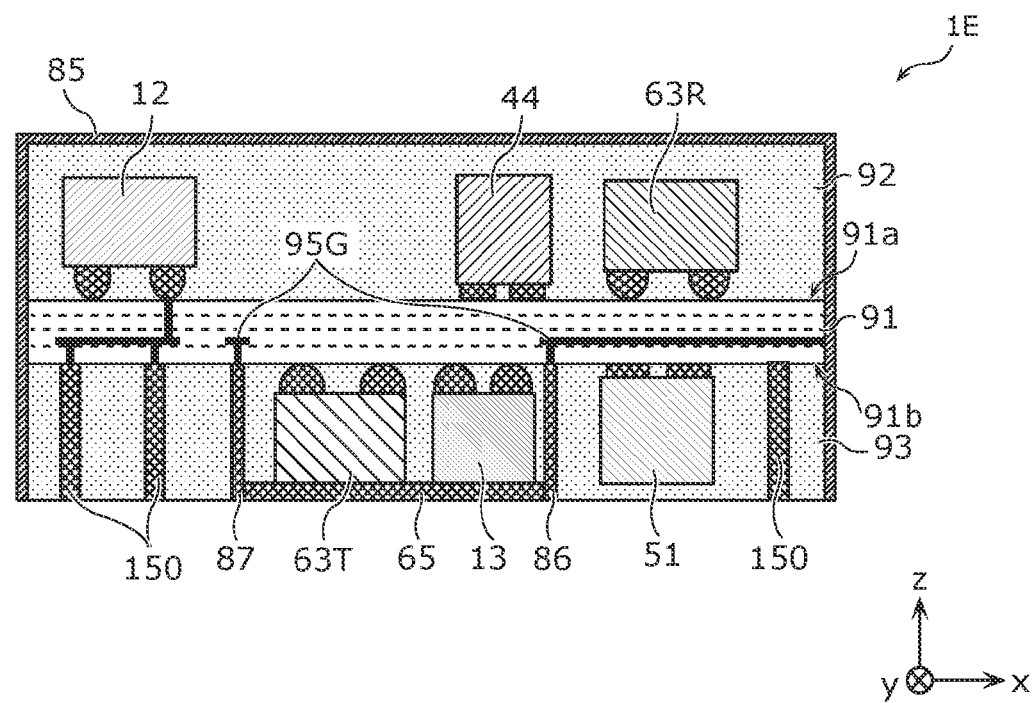
FIG. 4B is a cross-sectional view of the radio-frequency module according to Example 3.

FIG. 4A is a plan view of a radio-frequency module 1E according to Example 3. Furthermore, FIG. 4B is a cross-sectional view of the radio-frequency module 1E according to Example 3, specifically, a cross-sectional view taken along line IVB-IVB in FIG. 4A. Incidentally, FIG. 4A illustrates, when, of the main surfaces 91a and 91b facing each other of the module substrate 91, the main surface 91b is viewed from the positive side of the z axis, the layout of circuit components as seen through the main surface 91b.

Furthermore, in FIG. 4A, although the circuit components have marks representing their functions to facilitate understanding of a layout relationship between the circuit components, these marks are not put in the actual radio-frequency module 1E.

The radio-frequency module 1E according to Example 3 specifically represents the layout and configuration of circuit elements constituting the radio-frequency module 1 according to the embodiment.

When compared with the radio-frequency module 1A according to Example 1, the radio-frequency module 1E illustrated in FIGS. 4A and 4B differs from the radio-frequency module 1A in that metal shield plates 86 and 87 are disposed. In the radio-frequency module 1E according to this example, a description of a configuration that is the same as a configuration in the radio-frequency module 1A according to Example 1 is omitted, and a description will be given below with emphasis on a configuration different from the configuration in the radio-frequency module 1A.

When compared with the radio-frequency module 1A according to Example 1, the radio-frequency module 1E further includes the metal shield plates 86 and 87.

The metal shield plate 86 is erected on the main surface 91b and is disposed between the transmission filter 63T and the low noise amplifier 21 when the module substrate 91 is viewed in plan. The metal shield plate 86 is joined to the ground electrode formed on the main surface 91b and to the metal electrode 65. Incidentally, the metal shield plate 86 may be connected to a ground electrode layer 95G formed in the module substrate 91. The metal shield plate 86 is joined to the ground electrode and to the metal electrode 65 at its upper and lower ends and is disposed between the transmission filter 63T and the low noise amplifier 21, and thus a function of shielding against an electromagnetic field between the transmission filter 63T and the low noise amplifier 21 can be strengthened. Hence, isolation between transmission and reception in the radio-frequency module 1E can be further improved.

Furthermore, the metal shield plate 87 is erected on the main surface 91b and is joined to the ground electrode formed on the main surface 91b and to the metal electrode 65.

Thus, the metal electrode 65 serves as a ground electrode, a transmission signal and a harmonic that are radiated from the transmission filter 63T can therefore be suppressed, and noise can also be kept from entering the transmission filter 63T from the outside. Hence, isolation between signals can be improved while the heat dissipation of the radio-frequency module 1E is improved.

A detailed structure of each of the metal shield plates 86 and 87 will be described with reference to FIGS. 5A to 5C.

Figure 5A:
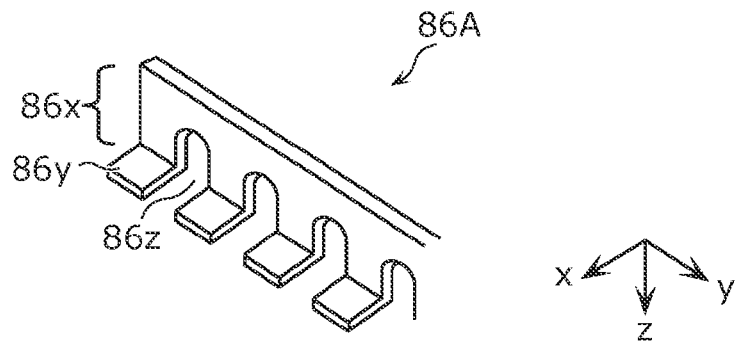
FIG. 5A is an external perspective view illustrating a first example of a metal shield plate.

FIG. 5A is an external perspective view of a metal shield plate 86A. The metal shield plate 86A illustrated in FIG. 5A is an example of the metal shield plates 86 and 87 according to Example 3. The metal shield plate 86A is erected from the main surface 91b (not illustrated) toward the negative side of the z axis. Between the metal shield plate 86A and the main surface 91b, holes 86z extending in a direction (x-axis direction) of a normal to the metal shield plate 86A are formed.

Furthermore, the metal shield plate 86A includes a body portion 86x erected from the main surface 91b toward the negative side of the z axis, and junction portions 86y provided on a main surface 91b side so as to extend in parallel to the main surface 91b and joined to the ground electrode (not illustrated) on the main surface 91b.

In the structure of the metal shield plate 86A, since the holes 86z are formed between the body portion 86x and the main surface 91b, in a process of forming the resin member 93 on the main surface 91b, good fluidity of a liquid resin near the metal shield plate 86A can be provided. Hence, occurrence of, for example, a void where no resin member 93 is formed near the metal shield plate 86A can be suppressed.

Figure 5B:
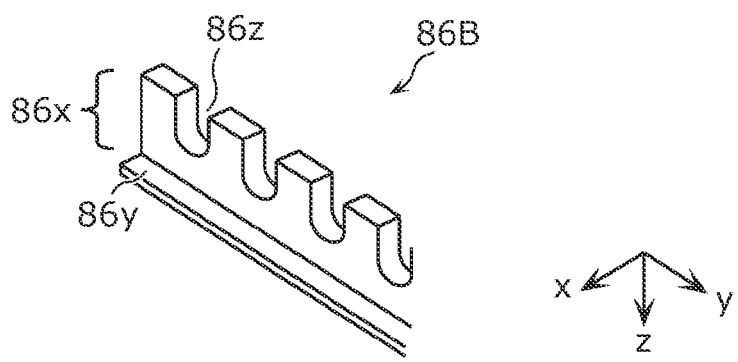
FIG. 5B is an external perspective view illustrating a second example of the metal shield plate.

FIG. 5B is an external perspective view of a metal shield plate 86B. The metal shield plate 86B illustrated in FIG. 5B is an example of the metal shield plates 86 and 87 according to Example 3. The metal shield plate 86B is erected from the main surface 91b (not illustrated) toward the negative side of the z axis. Between the metal shield plate 86B and the plane containing the top surface 63b, holes 86z extending in a direction (x-axis direction) of a normal to the metal shield plate 86B are formed.

Furthermore, the metal shield plate 86B includes a body portion 86x erected from the main surface 91b toward the negative side of the z axis, and a junction portion 86y provided on the main surface 91b side so as to extend in parallel to the main surface 91b and joined to the ground electrode (not illustrated) on the main surface 91b.

In the structure of the metal shield plate 86B, since the holes 86z are formed between the body portion 86x and the plane containing the top surface 63b, in a process of forming the resin member 93 on the main surface 91b, good fluidity of a liquid resin near the metal shield plate 86B can be provided. Hence, occurrence of, for example, a void where no resin member 93 is formed near the metal shield plate 86B can be suppressed. Furthermore, since no holes 86z are formed in a region (a lower region of the body portion 86x) in contact with the main surface 91b, isolation between circuit components disposed on the main surface 91b with the metal shield plate 86B interposed between the circuit components is improved.

Figure 5C:
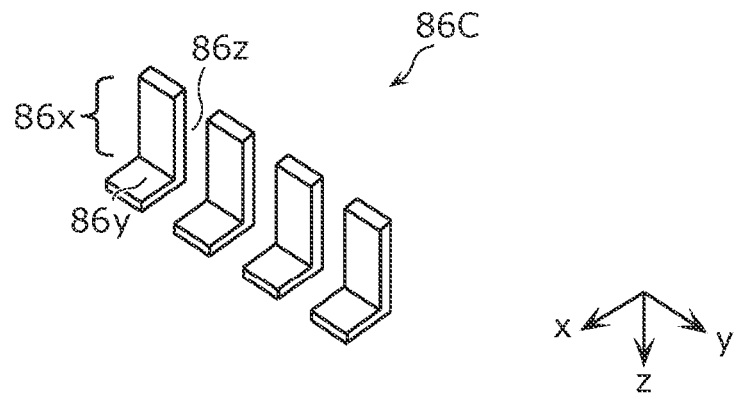
FIG. 5C is an external perspective view illustrating a third example of the metal shield plate.

FIG. 5C is an external perspective view of a metal shield plate 86C. The metal shield plate 86C illustrated in FIG. 5C is an example of the metal shield plates 86 and 87 according to Example 3. The metal shield plate 86C is erected from the main surface 91b (not illustrated) toward the negative side of the z axis. Between the main surface 91b and the plane containing the top surface 63b, holes 86z extending in a direction (x-axis direction) of a normal to the metal shield plate 86C are formed.

Furthermore, the metal shield plate 86C includes body portions 86x erected from the main surface 91b toward the negative side of the z axis, and junction portions 86y provided on the main surface 91b side so as to extend in parallel to the main surface 91b and joined to the ground electrode (not illustrated) on the main surface 91b. In the metal shield plate 86C, a plurality of body portions 86x are discretely disposed with the holes 86z interposed therebetween, and a plurality of junction portions 86y are also discretely disposed with the holes 86z interposed therebetween.

In the structure of the metal shield plate 86C, since the holes 86z are formed between the main surface 91b and the plane containing the top surface 63b, in a process of forming the resin member 93 on the main surface 91b, good fluidity of a liquid resin near the metal shield plate 86C can be provided. Hence, occurrence of, for example, a void where no resin member 93 is formed near the metal shield plate 86C can be suppressed.

Incidentally, an example of the structure of each of the metal shield plates 86 and 87 is not limited to the above-described metal shield plates 86A to 86C. For example, a plurality of holes 86z may be disposed from the main surface 91b to the plane containing the top surface 63b. Furthermore, a direction in which a junction portion 86y provided so as to extend is not limited to a positive direction of an x axis as illustrated in FIGS. 5A to 5C, and may be a negative direction of the x axis. Additionally, each of the metal shield plates 86 and 87 may include both a junction portion 86y provided so as to extend in the positive direction of the x axis and a junction portion 86y provided so as to extend in the negative direction of the x axis.

Figure 6:
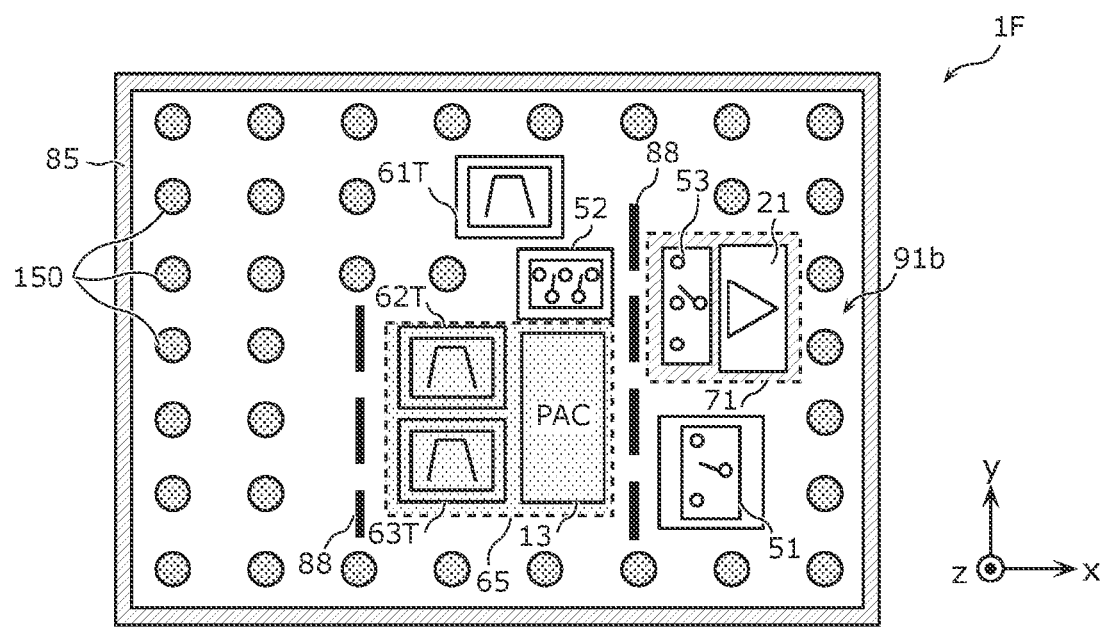
FIG. 6 is a plan view of a radio-frequency module according to Modification 3.

FIG. 6 is a plan view of a radio-frequency module 1F according to Modification 3. When compared with the radio-frequency module 1E according to Example 3, the radio-frequency module 1F illustrated in FIG. 6 differs from the radio-frequency module 1E only in that bonding wires 88 are disposed in place of the metal shield plates 86 and 87. In the radio-frequency module 1F according to this modification, a description of a configuration that is the same as a configuration in the radio-frequency module 1E according to Example 3 is omitted, and a description will be given below with emphasis on a configuration different from the configuration in the radio-frequency module 1E.

In the radio-frequency module 1E according to this example, a plurality of bonding wires 88 are disposed, in place of the metal shield plate 86, between the transmission filter 63T and the low noise amplifier 21. One end of each bonding wire 88 is joined to the ground electrode formed on the main surface 91b, and the other end is joined to the metal electrode 65.

Thus, a function of shielding against an electromagnetic field between the transmission filter 63T and the low noise amplifier 21 can be strengthened, and isolation between transmission and reception in the radio-frequency module 1F can therefore be further improved.

Furthermore, although not illustrated, in the radio-frequency module 1E according to this example, a plurality of external connection terminals 150 set at a ground may be disposed, in place of the metal shield plate 86, between the transmission filter 63T and the low noise amplifier 21. In this case, one end of each external connection terminal 150 is joined to the ground electrode formed on the main surface 91b, and the other end is joined to the metal electrode 65.

Thus, a function of shielding against an electromagnetic field between the transmission filter 63T and the low noise amplifier 21 can also be strengthened, and isolation between transmission and reception in the radio-frequency module 1E can therefore be further improved.

5. Layout and Configuration of Circuit Components of Radio-Frequency Module 1G According to Example 4

Figure 7A:
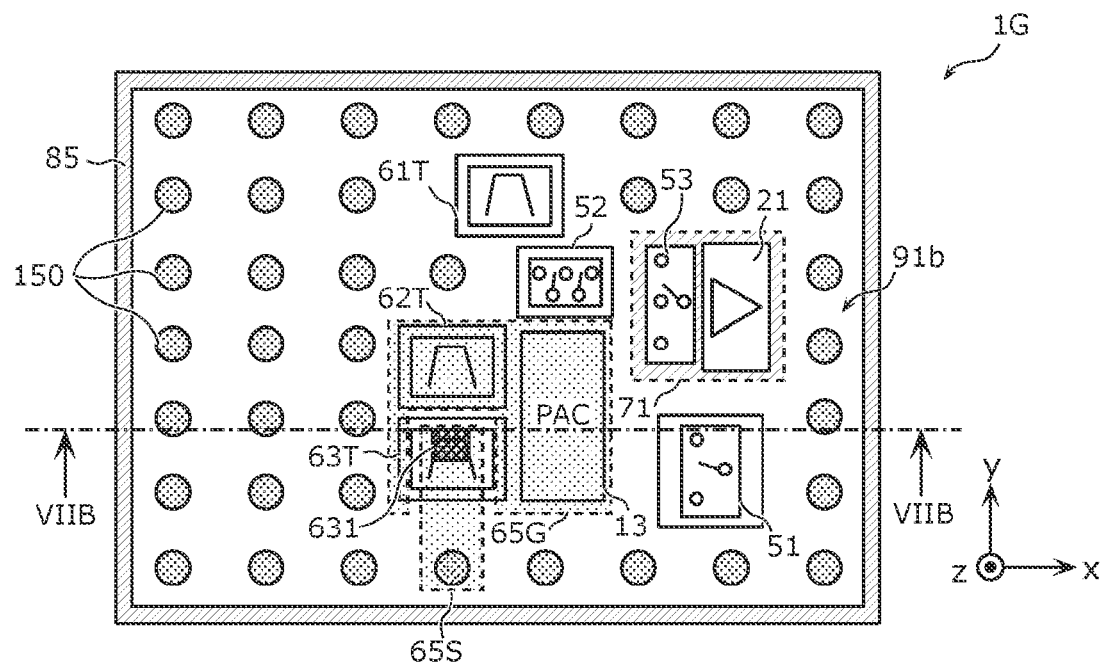
FIG. 7A is a plan view of a radio-frequency module according to Example 4.
Figure 7B:
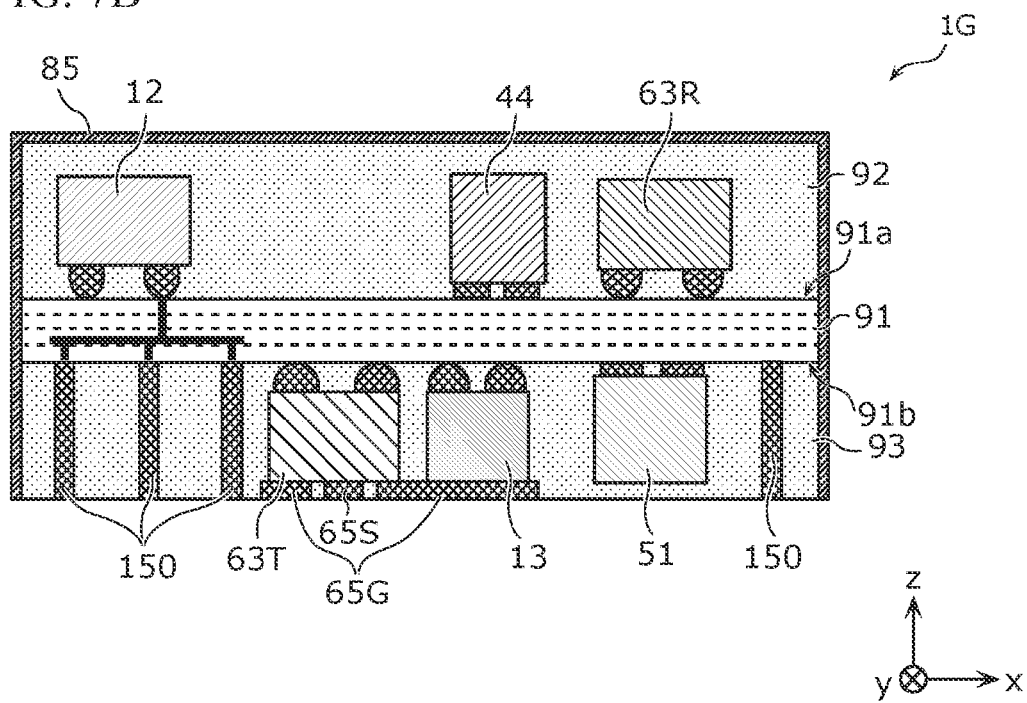
FIG. 7B is a cross-sectional view of the radio-frequency module according to Example 4.

FIG. 7A is a plan view of a radio-frequency module 1G according to Example 4. Furthermore, FIG. 7B is a cross-sectional view of the radio-frequency module 1G according to Example 4, specifically, a cross-sectional view taken along line VIIB-VIIB in FIG. 7A. Incidentally, FIG. 7A illustrates, when, of the main surfaces 91a and 91b facing each other of the module substrate 91, the main surface 91b is viewed from the positive side of the z axis, the layout of circuit components as seen through the main surface 91b. Furthermore, in FIG. 7A, although the circuit components have marks representing their functions to facilitate understanding of a layout relationship between the circuit components, these marks are not put in the actual radio-frequency module 1G.

The radio-frequency module 1G according to Example 4 specifically represents the layout and configuration of circuit elements constituting the radio-frequency module 1 according to the embodiment.

When compared with the radio-frequency module 1A according to Example 1, the radio-frequency module 1G illustrated in FIGS. 7A and 7B differs from the radio-frequency module 1A only in the layout and configuration of metal electrodes 65S and 65G. In the radio-frequency module 1G according to this example, a description of a configuration that is the same as a configuration in the radio-frequency module 1A according to Example 1 is omitted, and a description will be given below with emphasis on a configuration different from the configuration in the radio-frequency module 1A.

The metal electrode 65S is an example of the first metal electrode and is joined to the top surface 63b. The metal electrode 65S is a signal electrode (HOT electrode) that inputs a radio-frequency signal to the transmission filter 63T or outputs a radio-frequency signal from the transmission filter 63T. The metal electrode 65S may be connected, for example, to an input-output terminal 631 disposed in or on the bottom surface 63a of the transmission filter 63T via a via conductor.

Thus, since the metal electrode 65S is joined to the top surface 63b of the transmission filter 63T, heat generated by the transmission filter 63T can be dissipated to the external substrate side through the metal electrode 65S. Hence, the radio-frequency module 1G can be provided in which the heat dissipation of the transmission filter 63T, which is an acoustic wave filter, is improved.

Furthermore, in the radio-frequency module 1G according to this example, the metal electrode 65G is joined to the top surface 63b and is set at the ground. Thus, isolation between signals can be improved while the heat dissipation of the radio-frequency module 1G is improved.

Incidentally, in the radio-frequency module 1G according to this example, the metal electrode 65G does not have to be disposed.

6. Layout and Configuration of Circuit Components of Radio-Frequency Module 1H According to Example 5

Figure 8:
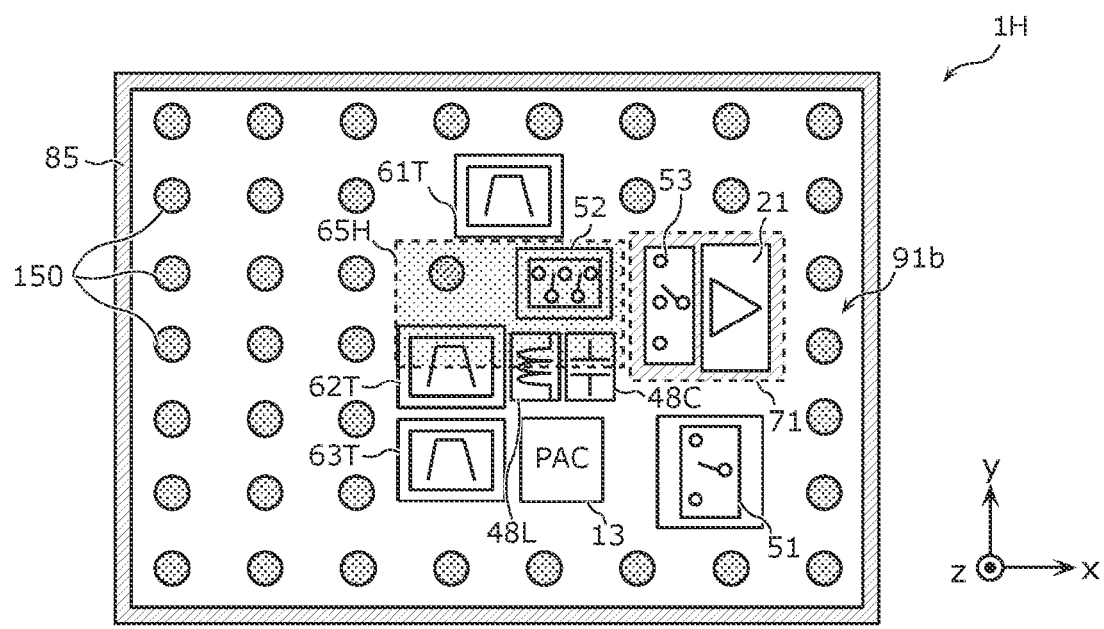
FIG. 8 is a plan view of a radio-frequency module according to Example 5.

FIG. 8 is a plan view of a radio-frequency module 1H according to Example 5. Incidentally, FIG. 8 illustrates, when, of the main surfaces 91a and 91b facing each other of the module substrate 91, the main surface 91b is viewed from the positive side of the z axis, the layout of circuit components as seen through the main surface 91b.

Furthermore, in FIG. 8, although the circuit components have marks representing their functions to facilitate understanding of a layout relationship between the circuit components, these marks are not put in the actual radio-frequency module 1H.

The radio-frequency module 1H according to Example 5 specifically represents the layout and configuration of circuit elements constituting the radio-frequency module 1 according to the embodiment.

When compared with the radio-frequency module 1A according to Example 1, the radio-frequency module 1H illustrated in FIG. 8 differs from the radio-frequency module 1A in the addition of a metal electrode 65H, an inductor 48L, and a capacitor 48C and in the placement and configuration of the metal electrode 65H. In the radio-frequency module 1H according to this example, a description of a configuration that is the same as a configuration in the radio-frequency module 1A according to Example 1 is omitted, and a description will be given below with emphasis on a configuration different from the configuration in the radio-frequency module 1A.

The inductor 48L is a surface mount device disposed on the main surface 91b. Furthermore, the capacitor 48C is a surface mount device disposed on the main surface 91b. The inductor 48L and the capacitor 48C are circuit components constituting, for example, a matching network included in the radio-frequency module 1H and are also circuit components constituting an LC filter included in the radio-frequency module 1H.

The metal electrode 65H is an example of the first metal electrode and is joined to the top surface 62b of the transmission filter 62T and to part of the inductor 48L and capacitor 48C at a plane containing the top surface 62b.

Thus, not only the heat dissipation of the transmission filter 62T but also heat dissipation of the surface mount devices constituting the radio-frequency module 1H can be improved. Hence, the heat dissipation of the radio-frequency module 1H can be further improved.

7. Layout and Configuration of Circuit Components of Radio-Frequency Module 1J According to Example 6

Figure 9:
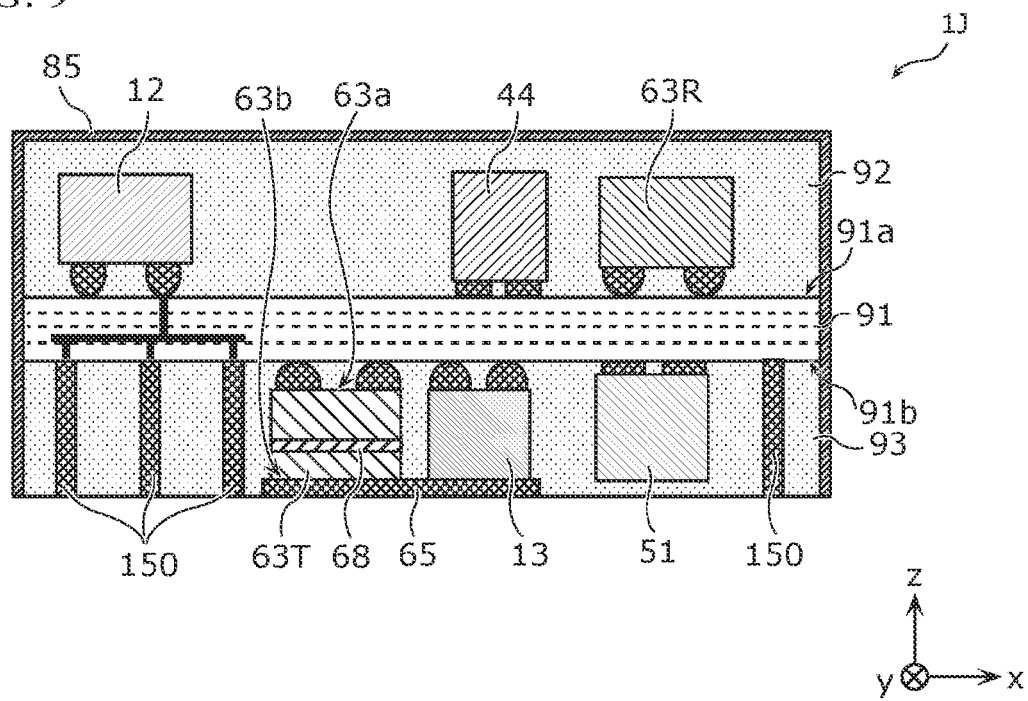
FIG. 9 is a cross-sectional view of a radio-frequency module according to Example 6.

FIG. 9 is a cross-sectional view of a radio-frequency module 1J according to Example 6. The radio-frequency module 1J according to Example 6 specifically represents the layout and configuration of circuit elements constituting the radio-frequency module 1 according to the embodiment.

When compared with the radio-frequency module 1A according to Example 1, the radio-frequency module 1J illustrated in FIG. 9 differs from the radio-frequency module 1A only in the structure of the transmission filter 63T. In the radio-frequency module 1J according to this example, a description of a configuration that is the same as a configuration in the radio-frequency module 1A according to Example 1 is omitted, and a description will be given below with emphasis on a configuration different from the configuration in the radio-frequency module 1A.

The top surface 63b of the transmission filter 63T is joined to the metal electrode 65. The transmission filter 63T includes a circuit unit (not illustrated) formed at a location closer to the bottom surface 63a than the top surface 63b, and a barrier metal layer 68 formed between the metal electrode 65 and the above-described circuit unit. Incidentally, the circuit unit corresponds to a medium that propagates an acoustic wave.

The metal electrode 65 is a metal thin film formed, for example, by using the sputtering method and is copper, an alloy containing copper, or a multilayer body containing copper.

The barrier metal layer 68 is an example of a metal layer, and is, for example, titanium, tantalum, cobalt, tungsten, or an alloy containing at least one of titanium, tantalum, cobalt, and tungsten.

In the radio-frequency module 1J, since the metal electrode 65 is in contact with the transmission filter 63T, in some cases, metal (such as a Cu atom) diffuses from the metal electrode 65 toward the circuit unit of the transmission filter 63T. When the circuit unit is contaminated with, as an impurity, this metal that has diffused, the structure of the circuit unit is changed, sometimes resulting in a deterioration in filter bandpass characteristics.

On the other hand, in the above-described configuration of the radio-frequency module 1J, the barrier metal layer 68 is disposed between the metal electrode 65 and the circuit unit. This can make the degree of metal diffusion from the barrier metal layer 68 to the circuit unit lower than the degree of metal diffusion from the metal electrode 65 to the circuit unit. That is, when compared with a transmission filter in which no barrier metal layer 68 is disposed, metal can be kept from diffusing from the metal electrode 65 to the circuit unit. Hence, the deterioration in the filter bandpass characteristics of the transmission filter 63T can be suppressed while the heat dissipation of the radio-frequency module 1J is improved.

Incidentally, a description that the degree of metal diffusion from A to B is low refers to, for example, the fact that the weight of a metallic material constituting A that diffuses to B is small, or the fact that the speed at which a metallic material constituting A diffuses to B is low. Specifically, it is defined that the coefficient of diffusion of a metallic material constituting A to B is small.

That is, the barrier metal layer 68 is defined as a metal layer that has a smaller coefficient of diffusion of a metallic material constituting the barrier metal layer 68 to the circuit unit than the coefficient of diffusion of a metallic material constituting the metal electrode 65 to the circuit unit.

Figure 10A:
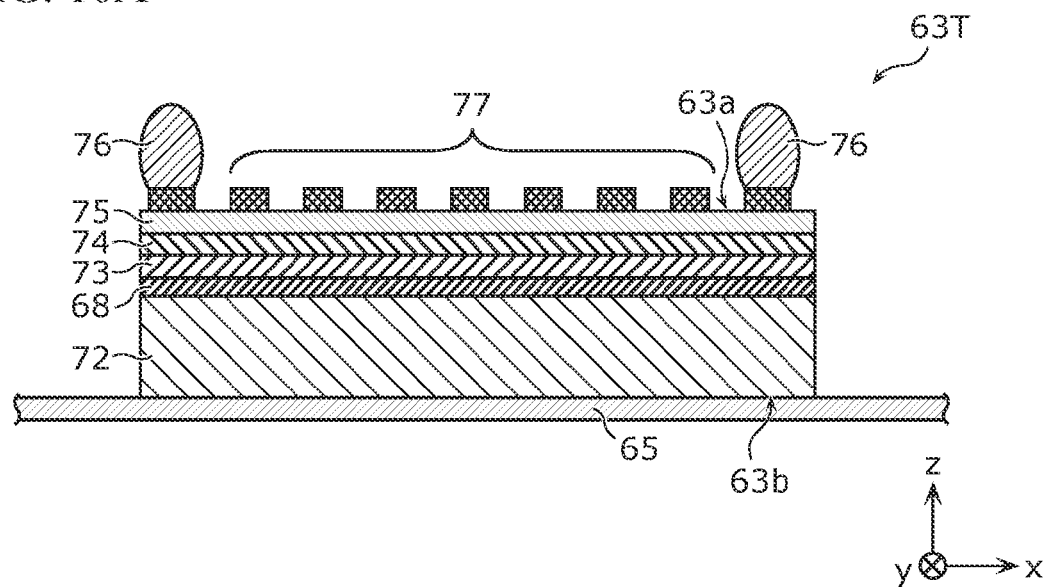
FIG. 10A is a cross-sectional view illustrating a configuration of a first example of a transmission filter according to Example 6.

FIG. 10A is a cross-sectional view illustrating a configuration of a first example of the transmission filter 63T according to Example 6.

The transmission filter 63T is a surface acoustic wave filter. As illustrated in FIG. 10A, the top surface 63b of the transmission filter 63T is joined to the metal electrode 65. Furthermore, the bottom surface 63a faces the main surface 91b and is connected to the main surface 91b via bump electrodes 76 formed on or above a surface of a piezoelectric layer 75.

The transmission filter 63T includes the piezoelectric layer 75, a supporting substrate 72, the barrier metal layer 68, a high acoustic velocity layer 73, a low acoustic velocity layer 74, and an IDT electrode 77. The supporting substrate 72, the barrier metal layer 68, the high acoustic velocity layer 73, the low acoustic velocity layer 74, the piezoelectric layer 75, and the IDT electrode 77 are stacked in sequence.

The piezoelectric layer 75 is made, for example, of a LiTaO$_3$ piezoelectric single crystal or piezoelectric ceramics.

The supporting substrate 72 is a substrate that supports the high acoustic velocity layer 73, the low acoustic velocity layer 74, the piezoelectric layer 75, and the IDT electrode 77 and is made, for example, of silicon.

The high acoustic velocity layer 73 is a layer in which a bulk wave that propagates through the layer is higher in acoustic velocity than acoustic waves, such as a surface acoustic wave and a boundary wave, that propagate along the piezoelectric layer 75. The high acoustic velocity layer 73 functions so that a surface acoustic wave is confined in a portion where the piezoelectric layer 75 and the low acoustic velocity layer 74 are stacked on top of each other and does not leak downward with respect to the high acoustic velocity layer 73.

The low acoustic velocity layer 74 is a layer in which a bulk wave that propagates through the layer is lower in acoustic velocity than a bulk wave that propagates through the piezoelectric layer 75 and is disposed between the piezoelectric layer 75 and the high acoustic velocity layer 73. Because of this structure and the property of an acoustic wave whose energy essentially concentrates on a low acoustic velocity medium, leakage of surface acoustic wave energy outside the IDT electrode 77 is suppressed.

Incidentally, the supporting substrate 72 and the high acoustic velocity layer 73 may be made of the same material. In this case, a high acoustic velocity supporting substrate may be provided.

In the above-described configuration, when a radio-frequency signal is input between a pair of comb-shaped electrodes constituting the IDT electrode 77, a potential difference occurs between the pair of comb-shaped electrodes, and thus the piezoelectric layer 75 is deformed to thereby generate a surface acoustic wave. Here, when a wavelength of the IDT electrode 77 (twice the distance between electrode fingers) is caused to substantially coincide with a wavelength in a pass band of the transmission filter 63T, only a radio-frequency signal with a frequency component desired to be passed passes through the transmission filter 63T.

Incidentally, when compared with an existing structure using a piezoelectric substrate of a single layer, the above-described stacked structure of the transmission filter 63T makes it possible to significantly increase Q factors at a resonant frequency and an anti-resonant frequency. That is, an acoustic wave resonator with a high Q factor can be constructed, and thus a filter that provides low insertion loss can be constructed by using this acoustic wave resonator.

Incidentally, a surface acoustic wave refers to propagation of an acoustic wave along the surface of the piezoelectric layer 75 or a boundary between a plurality of materials and refers to various types of acoustic waves generated by using the IDT electrode 77. Examples of a surface acoustic wave include a surface wave, a Love wave, a leaky wave, a Rayleigh wave, a boundary wave, a leaky SAW, a pseudo SAW, and a plate wave.

The IDT electrode 77, the piezoelectric layer 75, and the low acoustic velocity layer 74 are formed, of the bottom surface 63a and the top surface 63b of the transmission filter 63T, on a bottom surface 63a side and correspond to the circuit unit that propagates a surface acoustic wave.

Thus, the deterioration in the filter bandpass characteristics of the transmission filter 63T can be suppressed while the heat dissipation of the radio-frequency module 1J is improved.

Incidentally, the barrier metal layer 68 only has to be formed between the metal electrode 65 and the circuit unit.

Furthermore, the transmission filter 63T may be a bulk acoustic wave filter in addition to a surface acoustic wave filter.

Figure 10B:
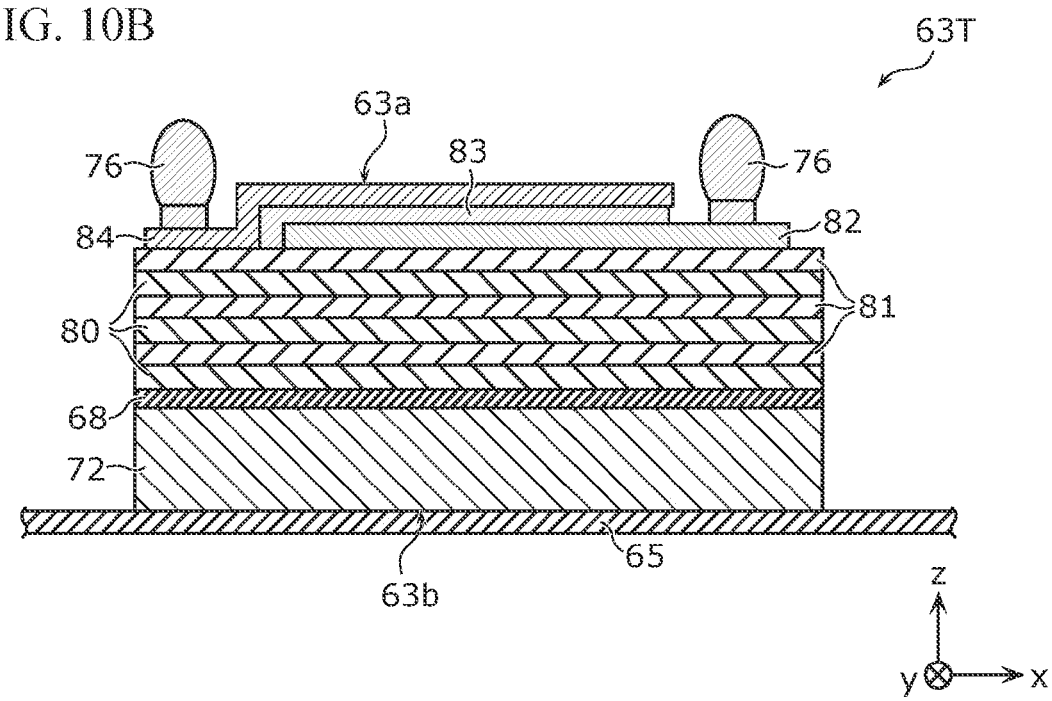
FIG. 10B is a cross-sectional view illustrating a configuration of a second example of the transmission filter according to Example 6.

FIG. 10B is a cross-sectional view illustrating a configuration of a second example of the transmission filter 63T according to Example 6.

The transmission filter 63T is an SMR (Solidly Mounted Resonator)-type bulk acoustic wave filter. As illustrated in FIG. 10B, the top surface 63b of the transmission filter 63T is in contact with the metal electrode 65. Furthermore, the bottom surface 63a (an upper electrode 84 and a lower electrode 82) of the transmission filter 63T faces the main surface 91b and is connected to the main surface 91b via the bump electrodes 76 formed on surfaces of the upper electrode 84 and the lower electrode 82.

The transmission filter 63T according to this example includes the supporting substrate 72, the barrier metal layer 68, low acoustic impedance films 81, high acoustic impedance films 80, the upper electrode 84 (second electrode), the lower electrode 82 (first electrode), and a piezoelectric layer 83. The low acoustic impedance films 81 are stacked alternately with the high acoustic impedance films 80 to thereby form an acoustic multilayer film. In the transmission filter 63T, the supporting substrate 72, the barrier metal layer 68, the acoustic multilayer film, the lower electrode 82, the piezoelectric layer 83, and the upper electrode 84 are stacked in sequence.

The supporting substrate 72 is a substrate that supports the acoustic multilayer film, the upper electrode 84, the piezoelectric layer 83, and the lower electrode 82 and is made, for example, of silicon.

In the above-described structure, the SMR-type bulk acoustic wave resonator confines a bulk acoustic wave in a portion (the upper electrode 84, the piezoelectric layer 83, and the lower electrode 82) below the acoustic multilayer film by using Bragg reflection caused by the acoustic multilayer film disposed between the supporting substrate 72 and the upper electrode 84.

In the above-described configuration, when a radio-frequency signal is input between the upper electrode 84 and the lower electrode 82, a potential difference occurs between both the electrodes, and thus the piezoelectric layer 83 is deformed to thereby generate a bulk acoustic wave in a direction in which the upper electrode 84, the piezoelectric layer 83, and the lower electrode 82 are stacked. Here, when a film thickness of the piezoelectric layer 83 is caused to correspond to a wavelength in the pass band of the transmission filter 63T, only a radio-frequency signal with a frequency component desired to be passed passes through the transmission filter 63T.

The upper electrode 84, the piezoelectric layer 83, and the lower electrode 82 are formed, of the bottom surface 63a and the top surface 63b of the transmission filter 63T, on the bottom surface 63a side and correspond to the circuit unit that propagates a bulk acoustic wave.

Thus, the deterioration in the filter bandpass characteristics of the transmission filter 63T can be suppressed while the heat dissipation of the radio-frequency module 1J is improved.

Incidentally, the barrier metal layer 68 only has to be formed between the metal electrode 65 and the circuit unit.

8. Layout and Configuration of Circuit Components of Radio-Frequency Module 1K According to Example 7

Figure 11:
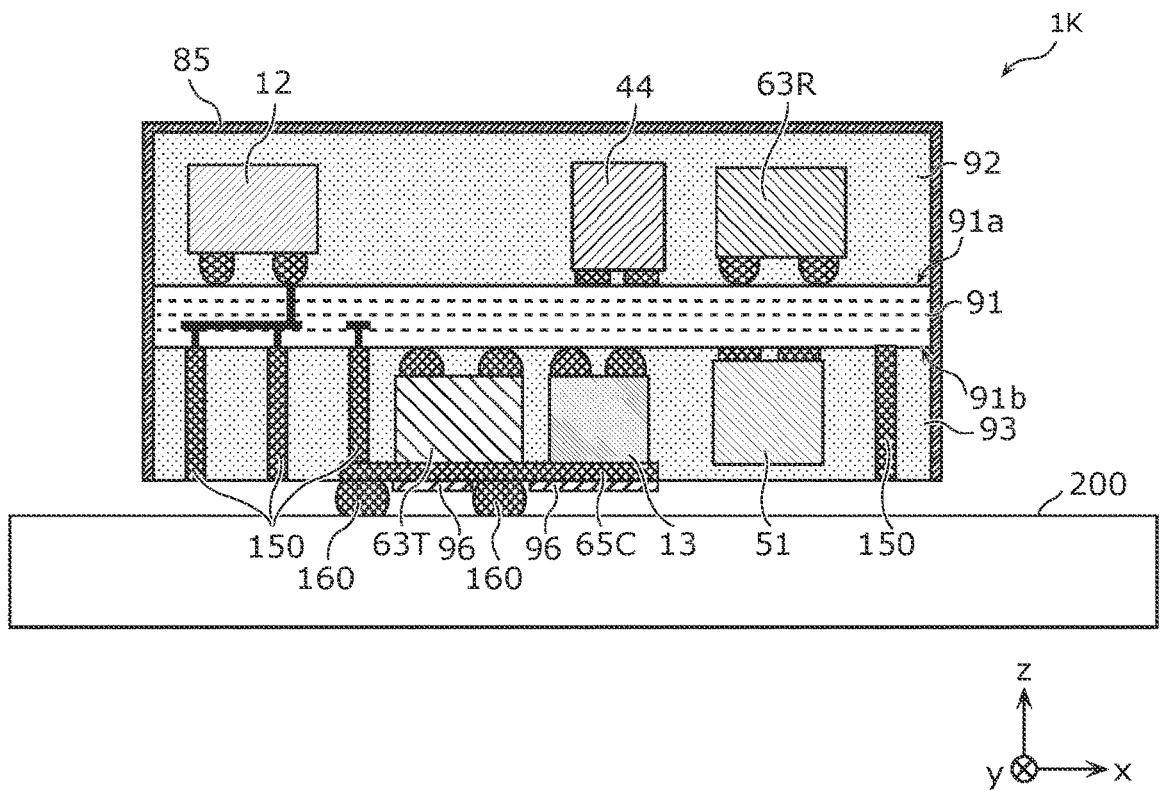
FIG. 11 is a cross-sectional view of a radio-frequency module according to Example 7.

FIG. 11 is a cross-sectional view of a radio-frequency module 1K according to Example 7. The radio-frequency module 1K according to Example 7 specifically represents the layout and configuration of circuit elements constituting the radio-frequency module 1 according to the embodiment.

When compared with the radio-frequency module 1C according to Example 2, the radio-frequency module 1K illustrated in FIG. 11 differs from the radio-frequency module 1C in that a resist layer 96 joined to the metal electrode 65C is added. In the radio-frequency module 1K according to this example, a description of a configuration that is the same as a configuration in the radio-frequency module 1C according to Example 2 is omitted, and a description will be given below with emphasis on a configuration different from the configuration in the radio-frequency module 1C.

The radio-frequency module 1K is connected to an external substrate 200 via bump electrodes 160 joined to a surface of the metal electrode 65C.

Here, at the surface of the metal electrode 65C, the resist layer 96 is formed to cover a region other than junction regions with the bump electrodes 160. The resist layer 96 is an insulating layer.

Thus, the resist layer 96 can keep an unnecessary short circuit from occurring between the metal electrode 65C and the external substrate 200.

9. Layout and Configuration of Circuit Components of Radio-Frequency Module 1L According to Example 8

Figure 12:
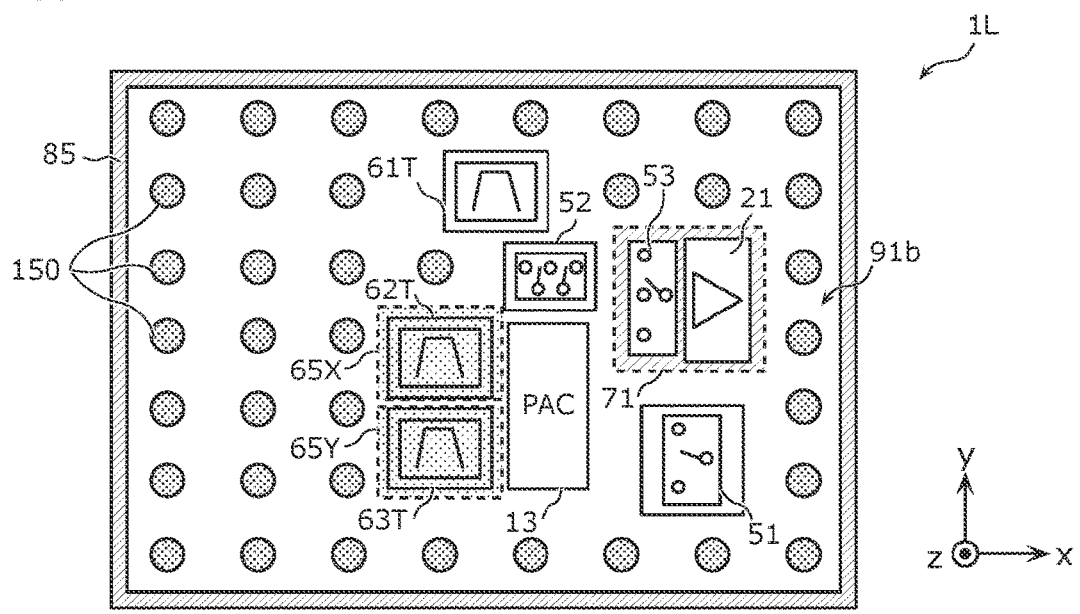
FIG. 12 is a plan view of a radio-frequency module according to Example 8.

FIG. 12 is a plan view of a radio-frequency module 1L according to Example 8. Incidentally, FIG. 12 illustrates, when, of the main surfaces 91a and 91b facing each other of the module substrate 91, the main surface 91b is viewed from the positive side of the z axis, the layout of circuit components as seen through the main surface 91b. Furthermore, in FIG. 12, although the circuit components have marks representing their functions to facilitate understanding of a layout relationship between the circuit components, these marks are not put in the actual radio-frequency module 1L.

The radio-frequency module 1L according to Example 8 specifically represents the layout and configuration of circuit elements constituting the radio-frequency module 1 according to the embodiment.

When compared with the radio-frequency module 1A according to Example 1, the radio-frequency module 1L illustrated in FIG. 12 differs from the radio-frequency module 1A in the layout and configuration of metal electrodes 65X and 65Y. In the radio-frequency module 1L according to this example, a description of a configuration that is the same as a configuration in the radio-frequency module 1A according to Example 1 is omitted, and a description will be given below with emphasis on a configuration different from the configuration in the radio-frequency module 1A.

The transmission filter 63T is an example of the first acoustic wave filter and passes a transmission signal in a transmission band of the first band. The transmission filter 63T has the bottom surface 63a (first bottom surface) and the top surface 63b (first top surface) facing each other. The bottom surface 63a faces the main surface 91b and is disposed closer to the main surface 91b than the top surface 63b.

The transmission filter 62T is an example of the second acoustic wave filter and passes a transmission signal in a transmission band of the second band. The transmission filter 62T has the bottom surface 62a (second bottom surface) and the top surface 62b (second top surface) facing each other. The bottom surface 62a faces the main surface 91b and is disposed closer to the main surface 91b than the top surface 62b.

The metal electrode 65Y is an example of the first metal electrode and is joined to the top surface 63b.

The metal electrode 65X is an example of a second metal electrode and is joined to the top surface 62b.

The metal electrode 65Y and the metal electrode 65X are isolated from each other and formed on the plane containing the top surface 63b and on the plane containing the top surface 62b.

In the above-described configuration, heat generated by the transmission filter 63T can be dissipated from the top surface 63b without necessarily passing through the module substrate 91, and heat generated by the transmission filter 62T can be dissipated from the top surface 62b without necessarily passing through the module substrate 91. Furthermore, since the metal electrode 65Y and the metal electrode 65X are isolated from each other and formed, transmission signals in different bands (frequencies) can be kept from interfering with each other through the metal electrodes 65X and 65Y. Hence, isolation between different bands can be improved while the heat dissipation of the transmission filters 62T and 63T is improved.

10. Effects

As described above, the radio-frequency module 1A according to the present embodiment includes the module substrate 91 having the main surfaces 91a and 91b facing each other, the transmission filter 63T that has the bottom surface 63a and the top surface 63b facing each other and passes a radio-frequency signal, and an external connection terminal 150 disposed on the main surface 91b. The bottom surface 63a faces the main surface 91a and is disposed closer to the main surface 91b than the top surface 63b. The radio-frequency module 1A further includes the metal electrode 65 joined to the top surface 63b.

Thus, since the metal electrode 65 is joined to the top surface 63b, heat generated by the transmission filter 63T can be dissipated to the external substrate side through the metal electrode 65. That is, heat generated by the transmission filter 63T can be dissipated from the top surface 63b without necessarily passing through the module substrate 91. Hence, the heat dissipation of the radio-frequency module 1A can be improved.

Furthermore, the radio-frequency module 1B further includes the power amplifier 11, the transmission filter 62T, and the switch 52 that switches between a connection between the power amplifier 11 and the transmission filter 63T and a connection between the power amplifier 11 and the transmission filter 62T.

Furthermore, in the radio-frequency module 1B, the transmission filter 62T may include the input-output terminal 621 connected to the switch 52, and, when the top surface 62b is viewed in plan, the input-output terminal 621 and the metal electrode 65B may overlap each other.

Thus, since the input-output terminal 621 that generates the largest amount of heat in the transmission filter 62T and whose temperature is likely to reach a high temperature and the metal electrode 65B overlap each other when the top surface 62b is viewed in plan, the heat dissipation of the transmission filter 62T can be improved more effectively.

Furthermore, in the radio-frequency module 1L, the transmission filter 63T passes a transmission signal in the first band, the transmission filter 62T passes a transmission signal in the second band, the transmission filter 62T has the bottom surface 62a and the top surface 62b facing each other, and the bottom surface 62a faces the main surface 91b and is disposed closer to the main surface 91b than the top surface 62b. The radio-frequency module 1L may include the metal electrode 65Y formed on the top surface 63b and the metal electrode 65X formed on the top surface 62b, and the metal electrode 65Y and the metal electrode 65X may be isolated from each other and formed on the plane containing the top surface 63b and on the plane containing the top surface 62b.

Thus, heat generated by the transmission filter 63T can be dissipated from the top surface 63b without necessarily passing through the module substrate 91, and heat generated by the transmission filter 62T can be dissipated from the top surface 62b without necessarily passing through the module substrate 91. Furthermore, since the metal electrode 65Y and the metal electrode 65X are isolated from each other and formed, transmission signals in different bands (frequencies) can be kept from interfering with each other through the metal electrodes 65X and 65Y. Hence, isolation between different bands can be improved while the heat dissipation of the transmission filters 62T and 63T is improved.

Furthermore, in the radio-frequency module 1A, the power amplifier 12 may be disposed on the main surface 91a, the radio-frequency module 1A may further include the via conductor 91V formed within the module substrate 91 and connecting the main surfaces 91a and 91b, one end of the via conductor 91V may be connected to the ground electrode of the power amplifier 12 at the main surface 91a, and another end of the via conductor 91V may be connected to the external connection terminal 150 set at the ground potential at the main surface 91b.

Thus, as a heat dissipation path of the power amplifier 12, of lines in the module substrate 91, a heat dissipation path running only through the planar wiring pattern having a large thermal resistance can be excluded. Hence, heat dissipation from the power amplifier 12 to the external substrate can be improved.

Furthermore, the radio-frequency module 1H may further include the surface-mount type inductor 48L and the surface-mount type capacitor 48C that are disposed on the main surface 91b, and the metal electrode 65H may be joined to the top surface 62b of the transmission filter 62T and may be joined to main surfaces of the inductor 48L and the capacitor 48C.

Thus, not only the heat dissipation of the transmission filter 62T but also the heat dissipation of the surface mount devices constituting the radio-frequency module 1H can be improved. Hence, the heat dissipation of the radio-frequency module 1H can be further improved.

Furthermore, in the radio-frequency module 1C, the metal electrode 65C may be set at the ground.

Thus, a transmission signal and a harmonic that are radiated from the transmission filter 63T can be suppressed, and noise can also be kept from entering the transmission filter 63T from the outside. Hence, isolation between signals can be improved while the heat dissipation of the radio-frequency module 1C is improved.

Furthermore, in the radio-frequency module 1C, the metal electrode 65C may be joined to the external connection terminal 150 on the plane containing the top surface 63b.

Furthermore, in the radio-frequency module 1C, the metal electrode 65C may be connected to the ground electrode formed on the main surface 91b via a bonding wire.

Furthermore, in the radio-frequency module 1D, the metal electrode 65 may be connected to the ground electrode formed on the main surface 91b via the via conductor 63V connecting the top surface 63b and the top surface 63a.

Furthermore, in the radio-frequency module 1G, the metal electrode 65S may be a signal electrode that inputs a radio-frequency signal to the transmission filter 63T or outputs a radio-frequency signal from the transmission filter 63T.

Thus, heat generated by the transmission filter 63T can be dissipated to the external substrate side through the metal electrode 65S. Hence, the heat dissipation of the radio-frequency module 1G is improved.

Furthermore, the radio-frequency module 1A may further include the low noise amplifier 21 disposed on the main surface 91b.

Thus, the power amplifiers 11 and 12, and the low noise amplifier 21 are provided on both the surfaces of the module substrate 91 such that the power amplifiers 11 and 12 are separated from the low noise amplifier 21 with the module substrate 91 interposed between the power amplifiers 11 and 12 and the low noise amplifier 21, therefore enabling an improvement in isolation between transmission and reception.

Furthermore, the radio-frequency module 1E may further include, on the main surface 91b, the metal shield plate 86 disposed between the transmission filter 63T and the low noise amplifier 21 when the module substrate 91 is viewed in plan, and the metal shield plate 86 may be joined to the ground electrode formed on the main surface 91b and to the metal electrode 65.

Thus, the metal electrode 65 serves as a ground electrode, a transmission signal and a harmonic that are radiated from the transmission filter 63T can therefore be suppressed, and noise can also be kept from entering the transmission filter 63T from the outside. Hence, isolation between signals can be improved while the heat dissipation of the radio-frequency module 1E is improved.

Furthermore, in the radio-frequency module 1E, the external connection terminal 150 may be disposed between the transmission filter 63T and the low noise amplifier 21 when the module substrate 91 is viewed in plan and may be set at the ground.

Furthermore, in the radio-frequency module 1J, the transmission filter 63T may include the circuit unit formed at a location closer to the bottom surface 63a than the top surface 63b, and the barrier metal layer 68 formed between the metal electrode 65 and the circuit unit.

Furthermore, in the radio-frequency module 1J, the metal electrode 65 may be copper, an alloy containing copper, or a multilayer body containing copper, and the barrier metal layer 68 may be titanium, tantalum, cobalt, tungsten, or an alloy containing at least one of titanium, tantalum, cobalt, and tungsten.

This can make the degree of metal diffusion from the barrier metal layer 68 to the circuit unit lower than the degree of metal diffusion from the metal electrode 65 to the circuit unit. That is, when compared with a transmission filter in which no barrier metal layer 68 is disposed, metal can be kept from diffusing from the metal electrode 65 to the circuit unit. Hence, the deterioration in the filter bandpass characteristics of the transmission filter 63T can be suppressed while the heat dissipation of the radio-frequency module 1J is improved.

Furthermore, in the radio-frequency module 1J, the transmission filter 63T may be a surface acoustic wave filter and may include the piezoelectric layer 75, the supporting substrate 72, the barrier metal layer 68, the high acoustic velocity layer 73, the low acoustic velocity layer 74, and the IDT electrode 77. The supporting substrate 72, the barrier metal layer 68, the high acoustic velocity layer 73, the low acoustic velocity layer 74, the piezoelectric layer 75, and the IDT electrode 77 may be stacked in sequence.

Furthermore, in the radio-frequency module 1J, the transmission filter 63T may be a bulk acoustic wave filter and may include the supporting substrate 72, the barrier metal layer 68, the acoustic multilayer film including the low acoustic impedance films 81 and the high acoustic impedance films 80 that are alternately stacked, the lower electrode 82 and the upper electrode 84, and the piezoelectric layer 83. The supporting substrate 72, the barrier metal layer 68, the acoustic multilayer film, the lower electrode 82, the piezoelectric layer 83, and the upper electrode 84 may be stacked in sequence.

Furthermore, the communication device 5 includes the RFIC 3 that processes radio-frequency signals transmitted and received by the antenna 2, and the radio-frequency module 1 that transmits a radio-frequency signal between the antenna 2 and the RFIC 3.

Thus, the communication device 5 can be provided in which heat dissipation of an acoustic wave filter is improved.

Other Embodiments

Although a radio-frequency module and a communication device according to the present disclosure have been described above with an embodiment, examples, and modifications, a radio-frequency module and a communication device according to the present disclosure are not limited to the above-described embodiment, examples, and modifications. The present disclosure also encompasses another embodiment achieved by combining any components in the above-described embodiment, examples, and modifications, modifications obtained by making various modifications conceived by a person skilled in the art to the above-described embodiment, examples, and modifications within the scope of the gist of the present disclosure, and various devices including the above-described radio-frequency modules and communication device.

For example, although, in Examples 1 to 3, a configuration is provided in which the transmission filter 63T is disposed on the main surface 91b and the metal electrode 65 is joined to the top surface 63b, a radio-frequency module according to the present disclosure may have a configuration in which, in place of the transmission filter 63T or in addition to the transmission filter 63T, at least one reception filter of the reception filters 61R to 63R is disposed on the main surface 91b and a top surface of this reception filter is joined to a metal electrode.

Thus, since the metal electrode is joined to the top surface of the reception filter, heat generated by the reception filter can be dissipated to the external substrate side through the metal electrode. That is, heat generated by the reception filter can be dissipated from the top surface of the reception filter without necessarily passing through the module substrate 91. Hence, the heat dissipation of the radio-frequency module can be improved.

For example, in the radio-frequency modules according to the above-described embodiment, examples, and modifications, circuit components constituting each radio-frequency module are disposed on both the surfaces of the module substrate 91, whereas each circuit component may be disposed on only the second main surface of the module substrate. That is, each circuit component constituting the above-described radio-frequency module may be mounted on one surface of the module substrate or may be mounted on both the surfaces.

For example, in the radio-frequency modules and the communication device according to the above-described embodiment, examples, and modifications, another circuit element, a line, and so forth may be inserted between paths connecting circuit elements and signal paths that are illustrated in the drawings.

INDUSTRIAL APPLICABILITY

The present disclosure can be widely used, as a radio-frequency module disposed in a multiband front-end section, in communication equipment, such as mobile phones.

REFERENCE SIGNS LIST 1, 1A, 1B, 1C, 1D, 1E, 1F, 1G, 1H, 1J, 1K, 1L radio-frequency module
2 antenna
3 RF signal processing circuit (RFIC)
4 baseband signal processing circuit (BBIC)
5 communication device
11, 12 power amplifier
13 PA control circuit
13a, 13b, 91a, 91b main surface
13V, 63V, 91V via conductor
21 low noise amplifier
41, 42, 43, 44, 45, 46, 47 matching network
48C capacitor
48L inductor
51, 52, 53 switch
61, 62, 63 duplexer
61R, 62R, 63R reception filter
61T, 62T, 63T transmission filter
62a, 63a bottom surface
62b, 63b top surface
65, 65B, 65C, 65G, 65H, 65S, 65X, 65Y metal electrode
68 barrier metal layer
71 semiconductor IC
72 supporting substrate
73 high acoustic velocity layer
74 low acoustic velocity layer 75, 83 piezoelectric layer
76, 160 bump electrode
77 IDT electrode
80 high acoustic impedance film
81 low acoustic impedance film
82 lower electrode
84 upper electrode
85 metal shield layer
86, 86A, 86B, 86C, 87 metal shield plate
86x body portion
86y junction portion
86z hole
88 bonding wire
91 module substrate
92, 93 resin member
95G ground electrode layer
96 resist layer
100 antenna connection terminal
111, 112 transmission input terminal
120 reception output terminal
130 control signal terminal
150 external connection terminal
200 external substrate
621, 631 input-output terminal

The invention claimed is:

1. A radio-frequency module comprising:
a module substrate having a first main surface and a second main surface facing each other;
a first acoustic wave filter having a first bottom surface and a first top surface facing each other, and configured to pass a radio-frequency signal;
an external connection terminal on the second main surface; and
a first metal electrode,
wherein the first bottom surface faces the second main surface and is closer to the second main surface than the first top surface, and
wherein the first metal electrode is joined to the first top surface.

2. The radio-frequency module according to claim 1, further comprising:
a power amplifier;
a second acoustic wave filter; and
a first switch configured to switch connection of the power amplifier between the first acoustic wave filter and the second acoustic wave filter.

3. The radio-frequency module according to claim 2, wherein the first acoustic wave filter comprises a first input-output terminal connected to the first switch, and
wherein the first input-output terminal and the first metal electrode overlap each other in a plan view of the radio-frequency module.

4. The radio-frequency module according to claim 2, wherein the first acoustic wave filter passes a transmission signal in a first band,
wherein the second acoustic wave filter passes a transmission signal in a second band different from the first band,
wherein the second acoustic wave filter has a second bottom surface and a second top surface facing each other,
wherein the second bottom surface faces the second main surface and is closer to the second main surface than the second top surface,
wherein the radio-frequency module further comprises a second metal electrode on the second top surface, and
wherein the first metal electrode and the second metal electrode are isolated from each other, and are on a plane comprising the first top surface and on a plane comprising the second top surface.

5. The radio-frequency module according to claim 2,
wherein the power amplifier is on the first main surface,
wherein the radio-frequency module further comprises a first via conductor within the module substrate that connects the first main surface and the second main surface, and
wherein a first end of the first via conductor is connected to a ground electrode of the power amplifier at the first main surface, and a second end of the first via conductor is connected to the external connection terminal set at ground potential at the second main surface.

6. The radio-frequency module according to claim 1, further comprising:
a surface mount device on the second main surface,
wherein the first metal electrode is joined to a main surface of the surface mount device.

7. The radio-frequency module according to claim 1, wherein the first metal electrode is at a ground potential.

8. The radio-frequency module according to claim 7, wherein the first metal electrode is joined to the external connection terminal on a plane comprising the first top surface.

9. The radio-frequency module according to claim 7, wherein the first metal electrode is connected to a ground electrode on the second main surface via a bonding wire.

10. The radio-frequency module according to claim 7, wherein the first metal electrode is connected to a ground electrode on the second main surface via a second via conductor that connects the first bottom surface and the first top surface.

11. The radio-frequency module according to claim 1, wherein the first metal electrode is a signal electrode configured to input the radio-frequency signal to the first acoustic wave filter or configured to output the radio-frequency signal from the first acoustic wave filter.

12. The radio-frequency module according to claim 1, further comprising:
a low noise amplifier on the second main surface.

13. The radio-frequency module according to claim 12, further comprising:
a metal shield plate on the second main surface between the first acoustic wave filter and the low noise amplifier in a plan view of the module substrate,
wherein the metal shield plate is joined to a ground electrode on the second main surface and to the first metal electrode.

14. The radio-frequency module according to claim 12, wherein the external connection terminal is between the first acoustic wave filter and the low noise amplifier in the plan view, and is at a ground potential.

15. The radio-frequency module according to claim 1,
wherein the first acoustic wave filter comprises:
a circuit closer to the first bottom surface than the first top surface, and
a metal layer between the first metal electrode and the circuit, and
wherein the metal layer is a barrier metal.

16. The radio-frequency module according to claim 1,
wherein the first acoustic wave filter comprises:
a circuit closer to the first bottom surface than the first top surface, and
a metal layer between the first metal electrode and the circuit, wherein the first metal electrode is copper, an alloy containing copper, or a multilayer body containing copper, and wherein the metal layer is titanium, tantalum, cobalt, tungsten, or an alloy comprising titanium, tantalum, cobalt, or tungsten.

17. The radio-frequency module according to claim 15, wherein the first acoustic wave filter is a surface acoustic wave filter and comprises:
   a piezoelectric layer;
   a supporting substrate;
   the metal layer;
   a high acoustic velocity layer in which an acoustic velocity of a bulk wave that propagates through the high acoustic velocity is higher than an acoustic wave that propagates along the piezoelectric layer;
   a low acoustic velocity layer in which an acoustic velocity of a bulk wave that propagates through the low acoustic velocity layer is lower than a bulk wave that propagates through the piezoelectric layer; and
   an interdigital transducer (IDT) electrode on the piezoelectric layer, and wherein the supporting substrate, the metal layer, the high acoustic velocity layer, the low acoustic velocity layer, the piezoelectric layer, and the IDT electrode are stacked in sequence, the metal layer being between the supporting substrate and the high acoustic velocity layer, the high acoustic velocity layer being between the metal layer and the low acoustic velocity layer, the low acoustic velocity layer being between the high acoustic velocity layer and the piezoelectric layer, and the piezoelectric layer being between the low acoustic velocity layer and the IDT electrode.

18. The radio-frequency module according to claim 15, wherein the first acoustic wave filter is a bulk acoustic wave filter and comprises:
   a supporting substrate;
   the metal layer;
   an acoustic multilayer film comprising a low acoustic impedance film and a high acoustic impedance film that are alternately stacked;
   a first electrode and a second electrode; and
   a piezoelectric layer, and wherein the supporting substrate, the metal layer, the acoustic multilayer film, the first electrode, the piezoelectric layer, and the second electrode are stacked in sequence, the metal layer being between the supporting substrate and the acoustic multifilm layer, the acoustic multilayer film being between the metal layer and the first electrode, the first electrode being between acoustic multilayer film and the piezoelectric layer, and the piezoelectric layer being between the first electrode and the second electrode.

19. A communication device comprising:
   a radio-frequency (RF) signal processing circuit configured to process radio-frequency signals transmitted and received by an antenna; and
   the radio-frequency module according to claim 1 configured to pass a radio-frequency signal between the antenna and the RF signal processing circuit.

\* \* \* \* \*